United States Patent
Igarashi et al.

(10) Patent No.: US 7,186,921 B2
(45) Date of Patent: Mar. 6, 2007

(54) CIRCUIT DEVICE AND MANUFACTURING METHOD THEREOF

(75) Inventors: Yusuke Igarashi, Gunma (JP); Sadamichi Takakusaki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/141,519

(22) Filed: May 31, 2005

(65) Prior Publication Data
US 2005/0263320 A1 Dec. 1, 2005

(30) Foreign Application Priority Data
May 31, 2004 (JP) .......................... P. 2004-162653

(51) Int. Cl.
*H05K 1/03* (2006.01)
(52) U.S. Cl. ...................... 174/255; 174/260
(58) Field of Classification Search ................ 174/255, 174/262, 260
See application file for complete search history.

(56) References Cited

U.S. PATENT DOCUMENTS 3,781,596 A * 12/1973 Galli et al. ................. 361/751
5,986,218 A * 11/1999 Muto et al. ................. 174/261
6,374,733 B1 * 4/2002 Hayama et al. ............. 101/170
6,718,631 B2 * 4/2004 Takeuchi ..................... 29/852

FOREIGN PATENT DOCUMENTS

JP 06-177295 6/1994

* cited by examiner

*Primary Examiner*—Ishwar (I. B.) Patel
(74) *Attorney, Agent, or Firm*—Fish & Richardson

(57) ABSTRACT

A circuit device which enables formation of a minute pattern while securing a current capacity and has excellent heat release properties, and a manufacturing method thereof are provided. In a circuit device of the present invention, among multiple wiring layers, a first wiring layer is formed of a thin first conductive pattern and a thick second conductive pattern. Therefore, formation of the minute patterns is realized while securing the current capacity. Moreover, a small-signal circuit element is mounted on the first conductive pattern, and a large-current circuit element is mounted on the second conductive pattern. Thus, circuit elements having different sizes of currents to be handled are mounted on the same board. Furthermore, heat release properties are improved by the second conductive pattern which is formed to be thick.

2 Claims, 21 Drawing Sheets

CIRCUIT DEVICE AND MANUFACTURING METHOD THEREOF

Priority is claimed to Japanese Patent Application Number JP2004-162653 filed on May 31, 2004, the disclosure of which is incorporated herein by reference in its entirety.

BACKGROUND OF THE INVENTION

1. Field of the Invention

The present invention relates to a circuit device and a manufacturing method thereof, and more particularly relates to a circuit device which has a multilayer wiring structure including conductive patterns having different thicknesses, and a manufacturing method thereof.

2. Description of the Related Art

With reference to FIGS. 22A and 22B, a description will be given of a configuration of a conventional hybrid integrated circuit device. This technology is described for instance in FIG. 1 in p. 4 in Japanese Patent Application Publication No. Hei 6 (1994)-177295. FIG. 22A is a perspective view of a hybrid integrated circuit device 100, and FIG. 22B is a cross-sectional view along the line X–X' in FIG. 22A.

The conventional hybrid integrated circuit device 100 has a configuration as described below. The hybrid integrated circuit device 100 includes a rectangular board 106, an insulating layer 107 provided on the surface of the board 106, a conductive pattern 108 formed on the insulating layer 107, a circuit element 104 fixed on the conductive pattern 108, a thin metal wire 105 which electrically connects the circuit element 104 and the conductive pattern 108, and a lead 101 electrically connected to the conductive pattern 108. The hybrid integrated circuit device 100 described above is entirely sealed with a sealing resin 102. As a method for sealing the device with the sealing resin 102, there are injection molding using a thermoplastic resin, and transfer molding using a thermosetting resin.

However, in the hybrid integrated circuit device 100 as described above, it is required to change a film thickness of a conductive pattern between a hybrid integrated circuit board (hereinafter referred to as a board) on which an element of a high current power system is mounted and a board on which an element of a small signal system is mounted.

For example, the film thickness is 100 μm in the power system, and 35 μm in the small signal system. However, if boards are separately prepared and mounted for the power system and the small signal system, costs are increased and miniaturization is difficult to achieve. Ideally, the power system and the small signal system are mounted on one board.

Furthermore, if the power system and the small signal system are mounted on one board by use of a Cu foil of a power system having a thickness of 100 μm, there is a problem that a pattern interval is increased since, of course, the Cu foil is thick. Moreover, although a pattern of the small signal system may be thin, weight is increased because the Cu foil is thick.

On the other hand, if the power system and the small signal system are mounted on one board by use of a Cu foil of a small signal system having a thickness of 35 μm, a minute pattern can be realized but there is a problem that it is impossible to flow a large current since, of course, the Cu foil is thin. Specifically, in the conventional case, the securing of a current capacity (a thick pattern), a thin pattern, and miniaturization are in a trade-off relationship.

Moreover, nowadays, an element such as a high-performance and high-power system LSI is included in a hybrid integrated circuit device. In order to include such an element having a great number of pins, it is required to form a more complex pattern inside the device and to secure high heat release properties. However, in the hybrid integrated circuit device 100 as described above, the conductive pattern 108 is formed of a single-layer wiring. Thus, it is difficult to allow wirings to intersect with each other. In order to allow the conductive patterns 108 to intersect with each other, a configuration using a jumper wire is also conceivable. However, in the case of using the jumper wire, a parasitic inductance may be generated in a portion of the jumper wire. Moreover, in the case where multiple layers of wirings are formed on the surface of a circuit board 16, there is also a problem that heat release properties of the entire device are lowered.

Moreover, in the case where a printed board having multiple layers of wirings is used as the circuit board 16, there is a problem that, since the printed board has poor heat release properties, it is difficult to include elements which generate a large amount of heat. Furthermore, in the case of adopting a ceramic board, there arises a problem that a wiring resistance is increased.

SUMMARY OF THE INVENTION

The present invention was made in consideration for the foregoing problems. The main object of the present invention is to provide a circuit device which has excellent heat release properties while securing a current capacity and enables densification and miniaturization, and to provide a manufacturing method thereof.

A circuit device of the present invention includes a plurality of wiring layers. In the circuit device, any of the wiring layers is formed of a first conductive pattern and a second conductive pattern formed to be thicker than the first conductive pattern. In addition, the front surfaces of the first and second conductive patterns are disposed at substantially the same level. Moreover, a convex part is formed so as to position the rear surface of the second conductive pattern lower than the rear surface of the first conductive pattern.

Moreover, a circuit device of the present invention includes a plurality of wiring layers. In the circuit device, any of the wiring layers is formed of a first conductive pattern and a second conductive pattern formed to be thicker than the first conductive pattern. In addition, the rear surfaces of the first and second conductive patterns are disposed at substantially the same level. Moreover, a convex part is formed so as to position the front surface of the second conductive pattern higher than the front surface of the first conductive pattern.

Furthermore, a circuit device of the present invention includes a plurality of wiring layers. In the circuit device, any of the wiring layers is formed of a first conductive pattern and a second conductive pattern formed to be thicker than the first conductive pattern. In addition, a convex part is formed so as to position the front surface of the second conductive pattern higher than the front surface of the first conductive pattern. Moreover, a convex part is formed so as to position the rear surface of the second conductive pattern lower than the rear surface of the first conductive pattern.

The present invention also provides a method of manufacturing a circuit device having a plurality of wiring layers, any of which includes a first conductive pattern and a second conductive pattern formed to be thicker than the first conductive pattern, comprising: forming a convex part by uniformly etching a conductive foil except for a region where the second conductive pattern is to be formed; and patterning the conductive foil to form the second conductive pattern to be thicker than the first conductive pattern.

According to the circuit device of the present invention, the rear surfaces of the first and second conductive patterns are disposed at substantially the same level. In addition, the convex part is formed so as to position the surface of the second conductive pattern higher than the surface of the first conductive pattern. Thus, conductive patterns having different thicknesses can be formed on one circuit board. Moreover, conductive patterns having different pattern rules depending on a required current capacity can be simultaneously formed on one circuit board. Thus, the circuit device can be miniaturized.

Moreover, according to the circuit device of the present invention, the surfaces of the first and second conductive patterns are disposed at substantially the same level. In addition, the convex part is formed so as to position the rear surface of the second conductive pattern lower than the rear surface of the first conductive pattern. Thus, by fixing a circuit element which handles a large current to the second conductive pattern in which the convex part is formed, heat generated from the circuit element can be actively released to the outside. Moreover, since the upper surfaces of the conductive patterns are maintained to be flat, mounting of the circuit element and electrical connection with thin metal wires are facilitated. Furthermore, conductive patterns having different thicknesses can be formed on one circuit board. Furthermore, conductive patterns having different pattern rules depending on a required current capacity can be simultaneously formed on one circuit board. Thus, the circuit device can be miniaturized.

Furthermore, according to the circuit device of the present invention, the convex part is formed so as to position the surface of the second conductive pattern higher than the surface of the first conductive pattern. In addition, the convex part is formed so as to position the rear surface of the second conductive pattern lower than the rear surface of the first conductive pattern. Thus, a high-current circuit element can be fixed to the second conductive pattern in which the convex part is formed to be thicker. At the same time, a current capacity can be secured, and heat generated from the circuit element can be actively released. Moreover, conductive patterns having different thicknesses can be formed on one circuit board. Furthermore, conductive patterns having different pattern rules depending on a required current capacity can be simultaneously formed on one circuit board. Thus, the circuit device can be miniaturized.

DESCRIPTION OF THE EMBODIMENTS

<First Embodiment>

Figure 1A:
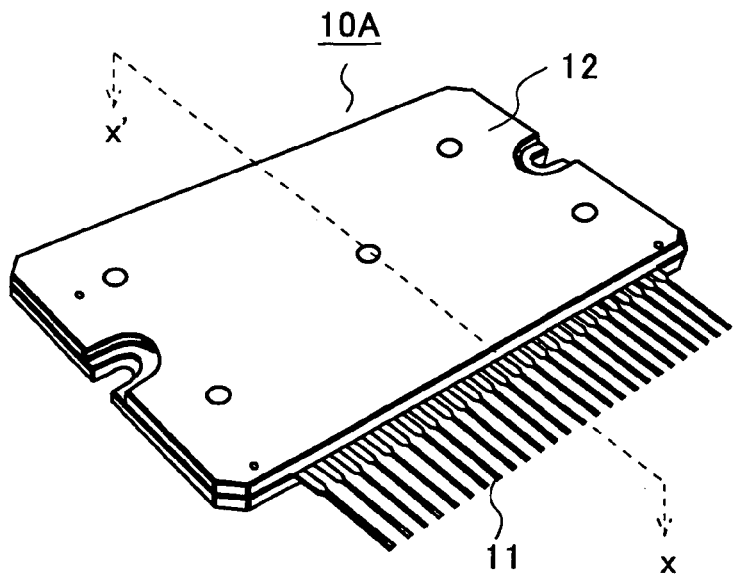
FIG. 1A is a perspective view and FIGS. 1B and 1C are cross-sectional views showing a circuit device of the preferred embodiment of the present invention.
Figure 1B:
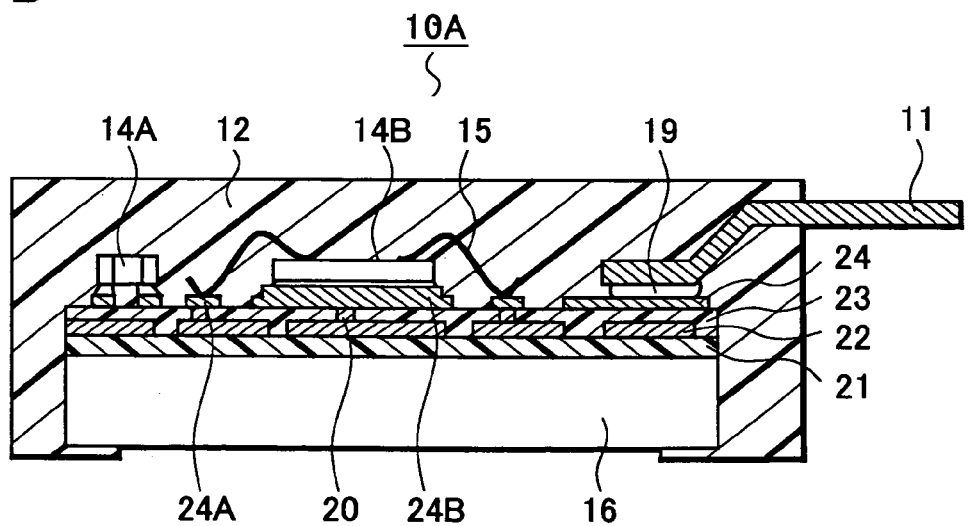
Figure 1C:
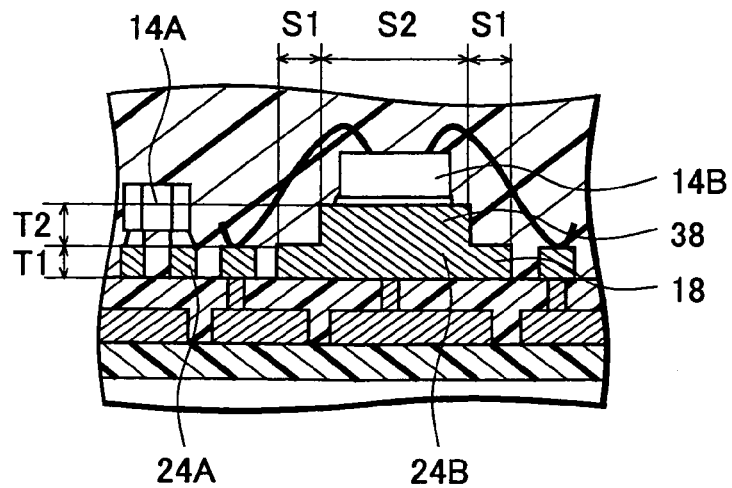

With reference to FIGS. 1A to 1C, a configuration of a circuit device 10A of this embodiment will be described. FIG. 1A is a perspective view of the circuit device 10A, and FIG. 1B is a cross-sectional view along the line X–X' in FIG. 1A. In addition, FIG. 1C is a partial cross-sectional view showing a second pattern 24B of this embodiment.

In this embodiment, the following multilayer structure is formed. Specifically, a first insulating layer 21 is formed on the surface of a circuit board 16 made of aluminum, and a first wiring layer 22 is formed on the surface of the first insulating layer 21. Moreover, a second insulating layer 23 is formed on the surface of the first wiring layer 22, and a second wiring layer 24 is formed on the surface of the second insulating layer 23. Furthermore, the second wiring layer 24 is formed of a first conductive pattern 24A and the second conductive pattern 24B formed to be thicker than the first conductive pattern 24A. The rear surfaces of the first and the second conductive patterns 24A and 24B are disposed at substantially the same level. Moreover, a convex part is formed so as to position the surface of the second conductive pattern 24B higher than the surface of the first conductive pattern 24A. Furthermore, there is formed a configuration in which a current flowing through the second conductive pattern 24B is larger than that flowing through the first conductive pattern 24A. The respective constituent components as described above will be described below.

In terms of heat release, a board made of metal, ceramic or the like may be used as the circuit board 16. However, a printed board made of a flexible sheet or resin may be used as the board as long as at least the surface of the board is subjected to insulation treatment. Moreover, for a material of the circuit board 16, Al, Cu, Fe or the like can be used as metal, and $Al_2O_3$ or AlN can be used as ceramic. Besides the above, a material excellent in mechanical strength or heat release properties can be used as the material of the circuit board 16. As an example, in a case where a board made of Al is used as the circuit board 16, there are two methods for insulating the circuit board 16 from the first wiring layer 22 formed thereon. One is a method for subjecting the surface of the aluminum board to alumite treatment. The other is a method for forming the first insulating layer 21 on the surface of the aluminum board, and forming the first wiring layer 22 on the surface of the first insulating layer 21.

Generally, one obtained by covering the latter Al board with an insulating resin is used. Here, with reference to FIG. 1B, in order to suitably release heat to the outside, the heat being generated from a circuit element 14 mounted on the surface of the circuit board 16, the rear surface of the circuit board 16 is exposed to an outside of a sealing resin 12. Moreover, in order to improve moisture resistance of the entire device, it is also possible to seal the entire device including the rear surface of the circuit board 16 by use of the sealing resin 12.

The circuit element 14 is fixed onto the second wiring layer 24. As the circuit element 14, an active element such as a transistor and a diode, or a passive element such as a condenser and a resistor is adopted. Moreover, an element with a large calorific value such as a power semiconductor element may be fixed to the circuit board 16 with a heat sink interposed therebetween, the heat sink being made of metal. Here, the active element which is mounted face up, or the like is electrically connected to the second wiring layer 24 with a thin metal wire 15.

In this embodiment, as the circuit element 14, there are various kinds of elements, including a small signal element and a large signal element. Here, a description will be given by assuming that a circuit element 14A through which a relatively small current flows, and a circuit element 14B through which a large current flows are mounted.

As a concrete example, an LSI chip, a condenser, a resistor, and the like can be used as the circuit element 14A.

Moreover, if the rear surface of a semiconductor element is connected to a ground potential, the rear surface thereof is fixed by use of a grazing material, a conductive paste or the like. Moreover, if the rear surface of the semiconductor element is in a floating state, the rear surface of the semiconductor element 14A is fixed by use of an insulating adhesive. Note that, if the semiconductor element is mounted face down, the element is mounted by means of a bump electrode made of solder or the like.

The circuit element 14B is connected to the second conductive pattern 24B. As the circuit element 14B, a power transistor which controls a large current, for example, a power MOS, a GTBT, an IGBT, a thyristor, and the like can be adopted. Moreover, a power IC can also be adopted. In recent years, since a chip is small, thin, and sophisticated, a large amount of heat is generated compared to the conventional case. That is the case for a CPU which controls a computer, and the like, for example.

With reference to FIG. 1C, the conductive patterns of this embodiment will be described. The second wiring layer 24 is formed of the first conductive pattern 24A and the second conductive pattern 24B formed to be thicker than the first conductive pattern 24A. Here, the rear surfaces of the first and the second conductive patterns 24A and 24B are disposed at substantially the same level. Moreover, a convex part 38 is formed so as to position the surface of the second conductive pattern 24B higher than the surface of the first conductive pattern 24A. Here, the second conductive pattern 24B is formed of regions S1 and S2 having different thicknesses, and has a structure in which the region S1 is adjacent to a periphery of the region S2. Moreover, the region S1 has a same thickness T1 as that of the first conductive pattern 24A, and the region S2 is formed to be thicker than the T1 by a T2. Therefore, in a periphery of the second conductive pattern 24B, an edge 18 having the same thickness as that of the first conductive pattern 24A is formed. In addition, the second conductive pattern 24B has a shape having a convex part in its center portion.

Moreover, the thickness of the second conductive pattern 24B is determined according to a thickness of a conductive foil to form wiring layers. Therefore, it is possible to adjust the thickness according to an amount of currents to flow or an amount of heat generated from elements mounted. Moreover, the thickness T1 of the first conductive pattern 24A is determined according to etching conditions in forming the convex part of the second conductive pattern. Therefore, according to a conductive foil to be adopted and the etching conditions, a ratio of the thicknesses of the first and the second conductive patterns 24A and 24B can be arbitrarily determined. A method for forming the conductive patterns will be described in detail later.

The wiring layers of this embodiment are made of metal such as copper, and are formed so as to be insulated from the circuit board 16. Moreover, on a side from which leads 11 are extended out, pads formed of a part of the wiring layer are formed. Although the leads are extended out from one side in the description, the leads may be extended out from at least one side. Furthermore, the wiring layers are laminated on the surface of the circuit board 16 by use of the insulating layers as an adhesive. The second wiring layer 24 is formed of the first conductive pattern 24A and the second conductive pattern 24B formed to be thicker than the first conductive pattern 24A. In addition, there is a pattern rule that the first conductive pattern 24A is narrower than the second conductive pattern 24B.

The first conductive pattern 24A is a pattern formed to be as thin as about several ten μm. The thickness of the first conductive pattern 24A is selected from about 9 μm to 80 μm, for example. The thickness of the first conductive pattern 24A suitable for a mass production level is, for example, about 30 μm. With this thickness, a space between the patterns can be reduced to about 50 μm by wet etching. Here, the space between the patterns means a distance from an inner end of a pattern to an inner end of another pattern adjacent thereto. Moreover, with the thickness described above, a width of the pattern can also be reduced to about 50 μm. Thus, minute patterns can be formed. To be more specific, the first conductive pattern 24A is used as a pattern through which an electric signal of about several milliamperes, for example, passes. The electric signal corresponds to, for example, a control signal of an LSI element.

The second conductive pattern 24B is a pattern which is formed to be thicker than the first conductive pattern 24A described above. The thickness of the second conductive pattern 24B can be selected from about 35 μm to 500 μm, according to a required current capacity. If the thickness of the second conductive pattern 24B is set to about 100 μm, the space between the patterns and the width thereof can be set to about 300 μm. In the case of the second conductive pattern 24B as described above, it is possible to allow a current of about 50 amperes to flow therethrough.

The first insulating layer 21 is formed on the entire surface of the circuit board 16, and has a function of attaching the rear surface of the first wiring layer 22 to the surface of the circuit board 16. Moreover, the first insulating layer 21 may be one obtained by mixing a large amount of inorganic fillers such as alumina in a resin. A distance between the lower end of the first wiring layer 22 and the surface of the circuit board 16 (a minimum thickness of the first insulating layer 21) may be not less than about 50 μm, although subject to change depending on a withstand pressure.

The lead 11 is fixed to the pad provided in the periphery of the circuit board 16, and has a function of performing input/output from/to the outside, for example. Here, a number of the leads 11 are provided on one side. The leads 11 are attached to the pads by use of a conductive adhesive such as solder (a brazing material).

The sealing resin 12 is formed by transfer molding using a thermosetting resin or by injection molding using a thermoplastic resin. Here, the sealing resin 12 is formed to seal the circuit board 16 and an electric circuit formed on the surface thereof, and the rear surface of the circuit board 16 is exposed from the sealing resin 12. Moreover, a sealing method other than sealing by molding is also applicable to the circuit device of this embodiment. For example, well-known sealing methods including sealing by resin potting, sealing by use of a case material, and the like can be applied.

Figure 2A:
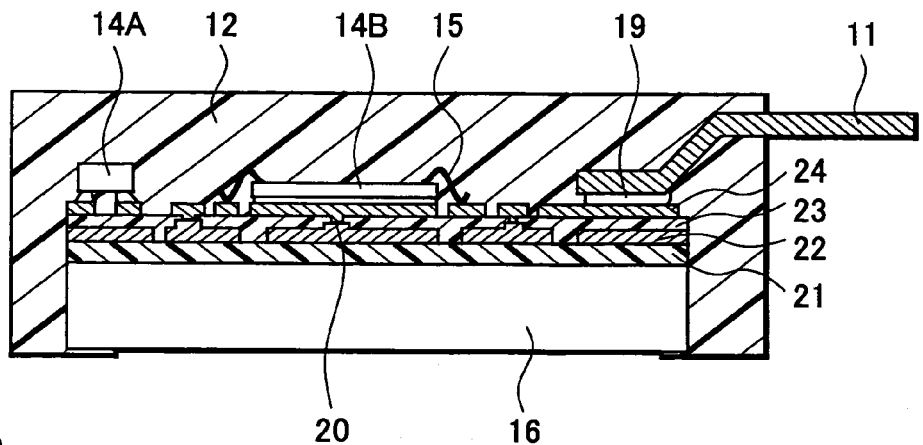
FIG. 2A is a cross-sectional view.
Figure 2B:
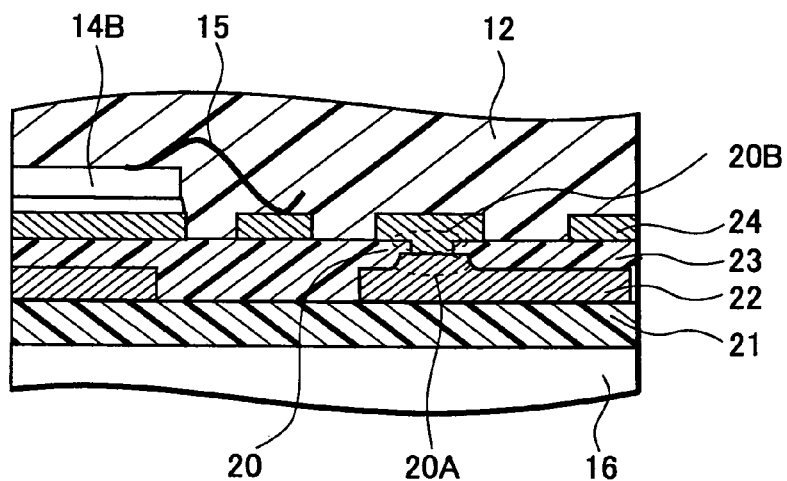
FIG. 2B is a schematic view and FIG. 2C is a perspective view showing the circuit device of the preferred embodiment of the present invention.
Figure 2C:
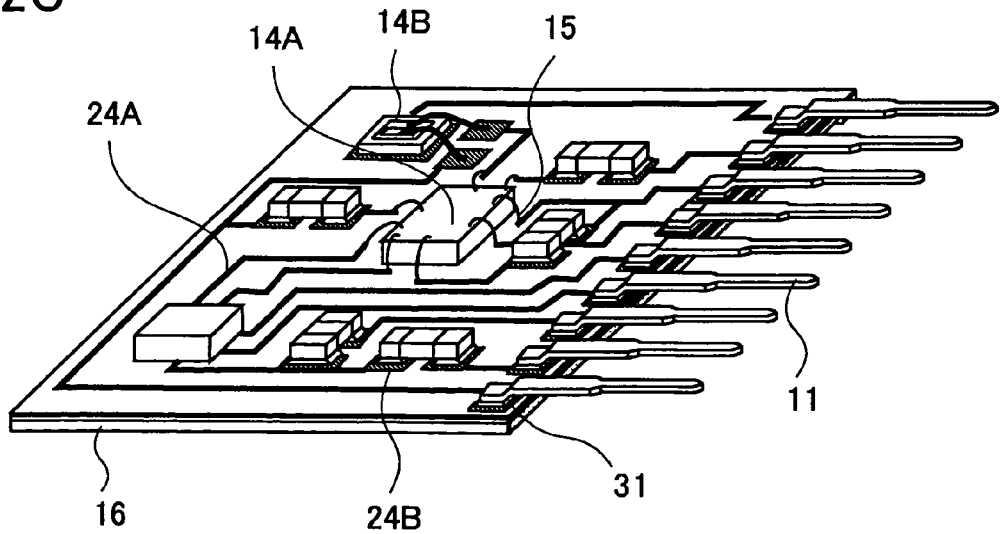

With reference to FIGS. 2A to 2C, the circuit device of this embodiment will be described.

With reference to FIGS. 2A and 2B, a description will be given of a portion where the wiring layers are connected in the circuit device of this embodiment. FIG. 2A is a cross-sectional view of the circuit device of this embodiment, and FIG. 2B is an enlarged cross-sectional view around a connection part 20.

With reference to FIGS. 2A and 2B, an electric circuit including the wiring layer and the circuit element 14 is formed on the surface of the circuit board 16 which functions as a supporting board. Moreover, the electric circuit formed on the surface of the circuit board 16 is sealed with the sealing resin 12. In the periphery of the circuit board 16, the lead 11 is fixed to the second wiring layer 24, and an end of the lead 11 is extended to the outside of the sealing resin 12. In this embodiment, the wiring layer has a multilayer wiring structure. Here, a two-layer wiring structure is realized, which includes the first wiring layer 22 and the second wiring layer 24. The respective wiring layers are laminated with insulating layers interposed therebetween. The circuit device having such a configuration will be described in detail below.

The first insulating layer 21 is formed on the surface of the circuit board 16 so as to substantially cover the entire surface thereof. As the first insulating layer 21, a resin containing fillers can be used. Here, as the fillers, for example, aluminum compounds, calcium compounds, potassium compounds, magnesium compounds or silicon compounds can be used. Moreover, in order to improve the heat release properties of the entire device, the first insulating layer 21 contains more fillers than the other insulating layer, and a filler content is, for example, about 60% to 80%. Furthermore, the heat release properties can also be improved by mixing fillers having a large diameter of 50 μm or more in the first insulating layer 21. A thickness of the first insulating layer 21 is changed depending on a required withstand voltage, and may be about 50 μm to several hundred μm.

The first wiring layer 22 is made of metal such as copper, and is patterned on the surface of the first insulating layer 21. The first wiring layer 22 is electrically connected to the second wiring layer 24 thereabove, and mainly has a function of extending a pattern.

The second insulating layer 23 is formed on the surface of the circuit board 16 to cover the first wiring layer 22. In the second insulating layer 23, the connection part 20 which electrically connects the first wiring layer 22 and the second wiring layer 24 is formed so as to penetrate the second insulating layer 23. Therefore, in order to facilitate formation of the connection part 20, the second insulating layer 23 may contain fewer fillers than the first insulating layer 21. This means that the second insulating layer 23 has a small filler content. Furthermore, for the same reason, a maximum particle diameter of the fillers contained in the second insulating layer 23 may be smaller than that of the fillers contained in the first insulating layer 21.

The second wiring layer 24 is formed on the surface of the second insulating layer 23. The second wiring layer 24 forms a land on which the circuit element 14 is mounted, pads connected to electrodes on the circuit element, a wiring part which electrically connects the pads, a pad on which the lead 11 is fixed, and the like. Moreover, the second wiring layer 24 and the first wiring layer 22 can be formed so as to planarly intersect with each other. Therefore, even if the semiconductor element 14A has a number of electrodes, the multilayer wiring structure of the present application enables a crossover and makes it possible to freely extend the pattern. The second wiring layer 24 and the first wiring layer 22 described above are connected to each other in a desired spot through the connection part 20. It is needless to say that, in accordance with the number of electrodes of the semiconductor element, a packaging density of elements, and the like, 3, 4, 5 or more of wiring layers can also be provided.

The connection part 20 is a part which penetrates the second insulating layer 23 and electrically connects the first wiring layer 22 and the second wiring layer 24. In this embodiment, the connection part 20 is formed of a first connection part 20A extended continuously from the first wiring layer 22, and a second connection part 20B extended continuously from the second wiring layer 24. More details about the connection part 20 will be described later with reference to FIG. 2B.

With reference to FIG. 2A, in order to suitably release heat to the outside, the heat being generated from the circuit element 14 mounted on the surface of the circuit board 16, the rear surface of the circuit board 16 is exposed to the outside from the sealing resin 12. Moreover, in order to improve moisture resistance of the entire device, it is also possible to seal the entire device including the rear surface of the circuit board 16 by use of the sealing resin 12.

With reference to the cross-sectional view of FIG. 2B, the connection part 20 will be described in detail. FIG. 2B is an enlarged cross-sectional view of a hybrid integrated circuit device 10, showing the connection part 20 and the vicinity thereof. The connection part 20 is a part which connects the laminated wiring layers to each other through the insulating layer. Moreover, the connection part 20 can also be used as a thermal via for thermally connecting the wiring layers to each other.

In this embodiment, the connection part 20 including the first connection part 20A and the second connection part 20B is formed. The first connection part 20A is a part protruded continuously from the first wiring layer 22 in its thickness direction. Here, the first connection part 20A is protruded upward and buried in the second insulating layer 23. The second connection part 20B is a part protruded continuously from the second wiring layer 24 in its thickness direction. Here, the second connection part 20B is protruded downward and buried in the second insulating layer 23.

The first connection part 20A is formed by etching processing so as to be protruded in the thickness direction, and is made of a Cu foil formed by plating or calendering. Moreover, the first connection part 20A can also be formed by use of a method other than etching processing. To be more specific, by depositing an electrolytic plated film or an electroless plated film so as to form a convex shape on the surface of the first wiring layer 22, the first connection part 20A can be formed. Moreover, it is also possible to form the first connection part 20A by providing a conductive material such as a brazing material including solder and the like, and a silver paste on the surface of the first wiring layer 22.

The second connection part 20B is a part formed by plating processing such as electrolytic plating and electroless plating.

In this embodiment, a spot where the above-described the first and the second connection parts 20A and 20B come into contact with each other is positioned in an intermediate portion of the second insulating layer 23 in its thickness direction. Here, the intermediate portion means a portion that is above the upper surface of the first wiring layer 22 and is below the lower surface of the second wiring layer 24. Therefore, although the spot where the first and the second connection parts 20A and 20B come into contact with each other is around a center portion of the second insulating layer 23 in its thickness direction on the page space, the spot can be changed within a range of the intermediate portion described above. Considering a case where the second connection part 20B is formed by plating processing, the portion where the first and the second connection parts 20A and 20B come into contact with each other is preferably disposed above an intermediate position between the upper surface of the first wiring layer and the lower surface of the second wiring layer. Thus, there is an advantage that formation of the second connection part 20B made of a plated film is facilitated. Specifically, this is because a depth of this via can be reduced when a via is formed to form the second connection part 20B. Moreover, as the via is formed to be shallow, a diameter of the via can be reduced. Furthermore, as the diameter of the via is reduced, an interval is narrowed, and an entire minute pattern can be realized.

Moreover, the first wiring layer 22 can also be formed to be partially thick. Accordingly, the first wiring layer 22 which is formed to be thick can be used as a power electrode or wiring. In addition, it is possible to form a miniaturized wiring by use of the first wiring layer 22 in other regions, which is thinly formed.

With reference to a perspective view of FIG. 2C, a description will be given of an example of specific shapes of the first and the second conductive patterns 24A and 24B which form the second wiring layer 24 formed on the surface of the circuit board 16. In FIG. 2C, the resin for sealing the entire device is omitted.

As described above, in this embodiment, the second wiring layer 24 can be divided into the first conductive pattern 24A which is formed to be thin and the second conductive pattern 24B which is formed to be thick. Specifically, a pattern through which a small signal passes can be designed as the first conductive pattern 24A, and a pattern through which a large signal passes can be designed as the second conductive pattern 24B. Here, as the large signal, for example, a signal for driving a speaker or a motor can be cited. Moreover, as the small signal, for example, a signal which is inputted to or outputted from the circuit element 14A that is an LSI element or an electric signal which is inputted to a control terminal of the circuit element 14B that is a switching element can be cited.

Here, a pattern connected to the circuit element 14A that is the LSI element is formed of the first conductive pattern 24A. Since an electric signal used for signal processing of the LSI element is about several milliamperes, the first conductive pattern 24A having a thickness of about several ten μm sufficiently covers a current capacity. Moreover, since the first conductive pattern 24A is minutely formed, the LSI element having a number of terminals can also be used as the circuit element 14A.

The second conductive pattern 24B is electrically connected to an inlet or outlet electrode of the circuit element 14B that is a power transistor. Specifically, based on a small signal inputted through the first conductive pattern 24A, the switching of an outflow current passing through the second conductive pattern 24B is performed.

Moreover, around the circuit element 14A, a number of pads are formed, to which the thin metal wires 15 are wire-bonded. In the case where a circuit element having a number of bonding pads is mounted, a wiring density is limited in a single layer pattern including only the second wiring layer 24. Thus, the pattern may not be sufficiently extended. In this embodiment, by constructing a multilayer wiring structure on the surface of the circuit board 16, a complex pattern extension is realized.

Therefore, by adjusting the thicknesses of the conductive patterns according to properties of the elements to be mounted and by providing multiple layers of wirings, the securing of the current capacity and densification of the circuit device are made possible.

Figure 4A:
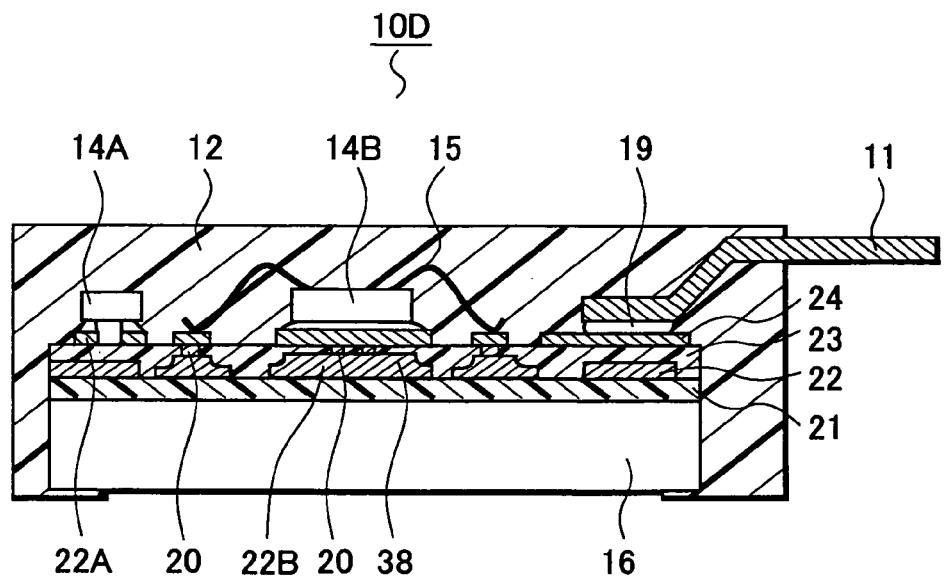
FIGS. 4A and 4B are cross-sectional views showing the circuit device of the preferred embodiment of the present invention.
Figure 4B:
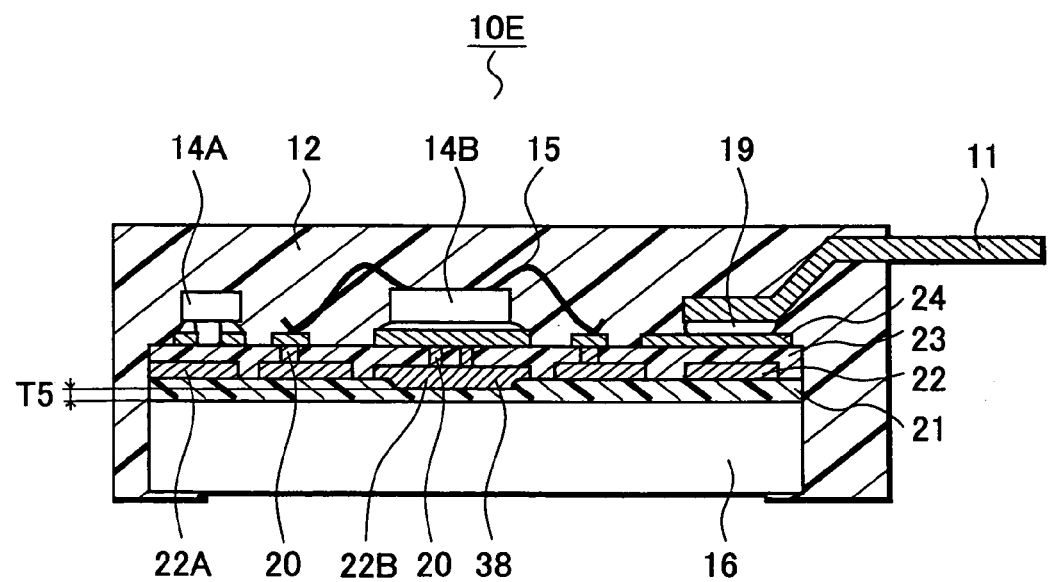
Figure 5:
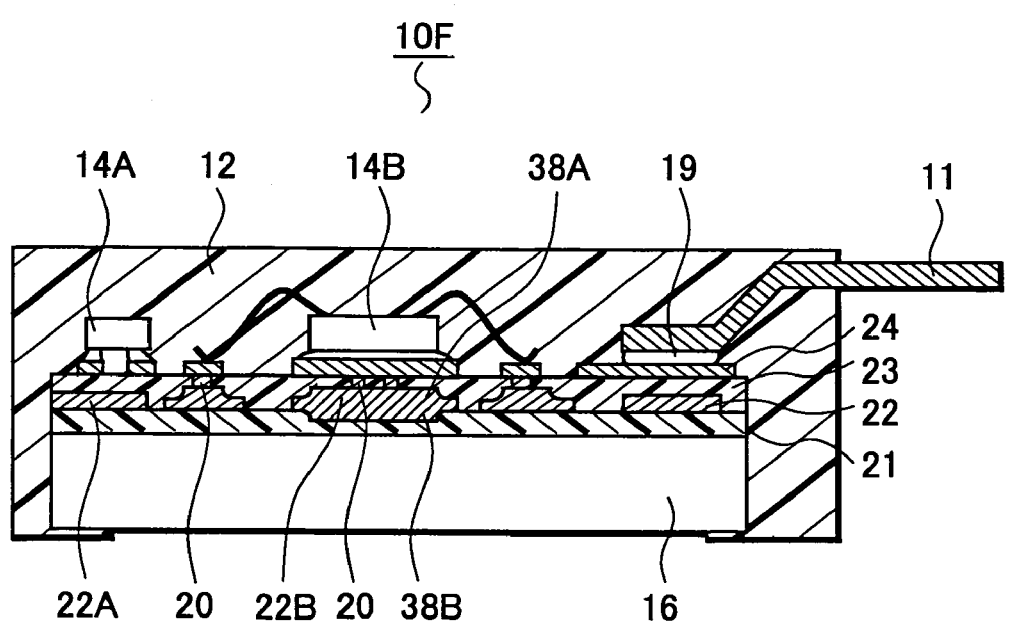
FIG. 5 is a cross-sectional view showing the circuit device of the preferred embodiment of the present invention.

With reference to FIGS. 3 to 5, other configurations of the circuit device of this embodiment will be described.

Figure 3A:
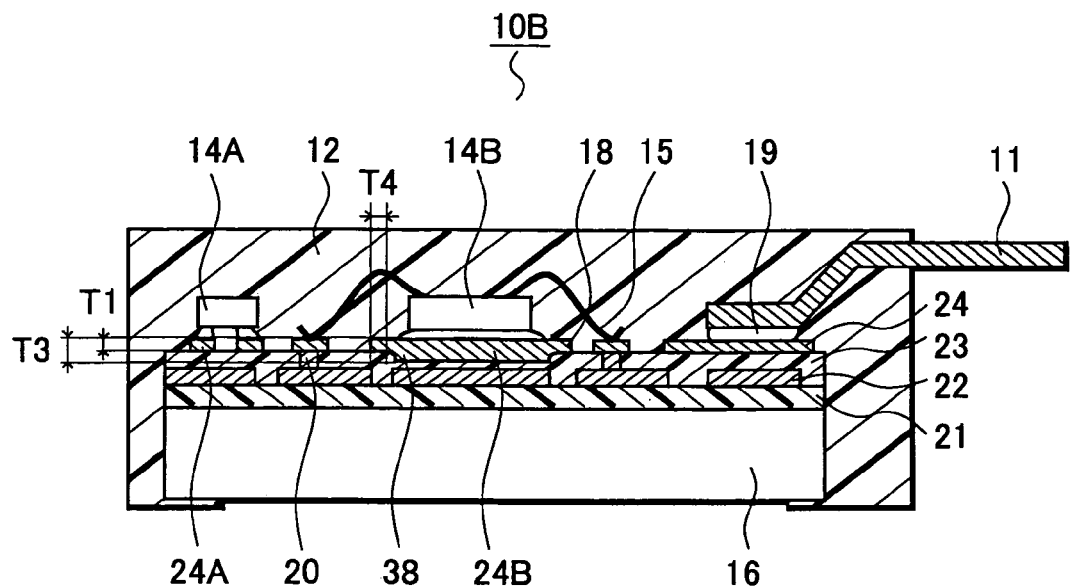
FIGS. 3A and 3B are cross-sectional views showing the circuit device of the preferred embodiment of the present invention.

First, with reference to FIG. 3A, a circuit device 10B will be described. The second wiring layer 24 is formed of the first conductive pattern 24A and the second conductive pattern 24B formed to be thicker than the first conductive pattern 24A. Here, the surfaces of the first and the second conductive patterns 24A and 24B are disposed at substantially the same level. In addition, the convex part 38 is formed so as to position the rear surface of the second conductive pattern 24B lower than the rear surface of the first conductive pattern 24A. Therefore, a cross-sectional area of the second conductive pattern 24B is increased, and a large current capacity can be secured. Moreover, an increased thickness enables reduction in a transient thermal resistance. Furthermore, the upper surfaces of the first and the second conductive patterns 24A and 24B are positioned on substantially the same plane. Therefore, since the upper surface of the second wiring layer 24 is formed to be flat, disposition of the circuit element 14 and installation of the thin metal wires 15 are facilitated. Moreover, the second conductive pattern 24B and the first wiring layer 22 come close to each other by providing the convex part 38. Thus, heat release properties are improved. Furthermore, a part of the first wiring layer 22 is used as a dummy pattern and disposed immediately below the second conductive pattern 24B. Thus, the heat release properties can be further improved.

Here, a thickness of the first conductive pattern 24A is set as the T1, and a thickness of the second conductive pattern 24B is set as a T3. In order to minutely form the first conductive pattern 24A, the T1 may be set to about 9 μm to 80 μm. Meanwhile, in order to secure a current capacity of the second conductive pattern 24B, the T3 may be set to about 35 μm to 500 μm. Specifically, compared to the first conductive pattern 24A, the thickness of the second conductive pattern 24B is increased by a difference between the T3 and the T1.

The edge 18 is a part formed in a peripheral portion of the second conductive pattern 24B, and a thickness thereof is the same as that of the first conductive pattern 24A. The edge 18 is provided because the conductive patterns are formed by etching. This is because, in simple terms, a thick portion and a thin portion can be patterned at the same time if etching is performed in the thin portion. The thick portion is etched unless there is a certain margin. Thus, there occurs a problem that the thick portion is not separated even though the thin portion is etched. Note that a width T4 of the edge 18 is preferably not less than the thickness T1 of the first conductive pattern 24A.

Figure 3B:
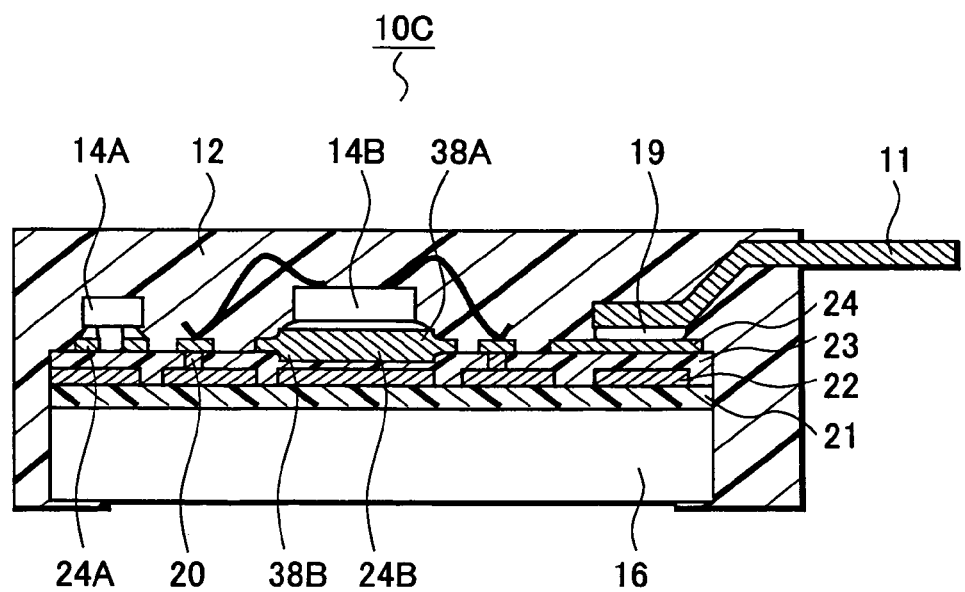

Next, with reference to FIG. 3B, a circuit device 10C will be described. The second wiring layer 24 is formed of the first conductive pattern 24A and the second conductive pattern 24B formed to be thicker than the first conductive pattern 24A. Here, a convex part 38A is formed so as to position the surface of the second conductive pattern 24B higher than the surface of the first conductive pattern 24A. In addition, a convex part 38B is formed so as to position the rear surface of the second conductive pattern 24B lower than the rear surface of the first conductive pattern 24A. Therefore, a cross-sectional area of the second conductive pattern 24B is further increased, and a larger current capacity can be secured. Moreover, an increased thickness makes it possible to significantly reduce a transient thermal resistance. Furthermore, since the convex part 38B is buried in the second insulating layer 23, the convex part 38B and the first wiring layer 22 come close to each other. Thus, heat release properties are improved. Moreover, by adjusting thicknesses of the convex parts 38A and 38B, conductive patterns according to characteristics of circuit elements can be formed.

Next, with reference to FIG. 4A, a circuit device 10D will be described. The first wiring layer 22 is formed of a first conductive pattern 22A and a second conductive pattern 22B formed to be thicker than the first conductive pattern 22A. Here, the rear surfaces of the first and the second conductive patterns 22A and 22B are disposed at substantially the same level. In addition, the convex part 38 is formed so as to position the surface of the second conductive pattern 22B higher than the surface of the first conductive pattern 22A. Therefore, the convex part 38 of the second conductive pattern 22B and a second wiring layer 24 come close to each other. Thus, heat from the circuit element 14B mounted on the second wiring layer 24 can be efficiently released to the circuit board 16. Furthermore, by providing the connection part 20 between the convex part 38 and the second wiring layer 24, heat release properties can be further improved.

Next, with reference to FIG. 4B, a circuit device 10E will be described. The first wiring layer 22 is formed of the first conductive pattern 22A and the second conductive pattern 22B formed to be thicker than the first conductive pattern 22A. Here, the surfaces of the first and the second conductive patterns 22A and 22B are disposed at substantially the same level. In addition, the convex part 38 is formed so as to position the rear surface of the second conductive pattern 22B lower than the rear surface of the first conductive pattern 22A. Therefore, since the second conductive pattern 22B is partially buried in the first insulating layer 21, the lower surface of the second conductive pattern 22B comes close to the surface of a circuit board 16. Thus, heat generated from the circuit element 14B can be released to the outside through the second conductive pattern 22B and the first insulating layer 21. Moreover, in order to improve heat release properties, the first insulating layer 21 is preferably thin within a range that can secure pressure resistance. To be more specific, assuming that a distance between the lowest portion of the second conductive pattern 22B and the surface of the circuit board 16 is a T5, the T5 may be about 50 μm to 200 μm in consideration of the pressure resistance. Furthermore, by providing the connection part 20 between the upper surface of the second conductive pattern 22B and the second wiring layer 24, heat release properties can be further improved.

Next, with reference to FIG. 5, a circuit device 10F will be described. The first wiring layer 22 is formed of the first conductive pattern 22A and the second conductive pattern 22B formed to be thicker than the first conductive pattern 22A. Here, the convex part 38A is formed so as to position the surface of the second conductive pattern 22B higher than the surface of the first conductive pattern 22A. In addition, the convex part 38B is formed so as to position the rear surface of the second conductive pattern 22B lower than the rear surface of the first conductive pattern 22A. Therefore, the convex part 38A of the second conductive pattern 22B comes close to the second wiring layer 24, and the convex part 38B comes close to the circuit board 16. Thus, heat generated from the circuit element 14B can be more efficiently released to the outside. Moreover, by connecting the upper portion of the convex part 38A to the second wiring layer 24 through the connection part 20, heat release properties can be further improved.

Next, with reference to FIGS. 6 to 12, a method for manufacturing the circuit device described above will be described.

Here, a description will be given of a method for manufacturing a circuit device in which the convex parts 38A and 38B are formed in the first and the second wiring layers 22 and 24.

Figure 6A:
FIGS. 6A to 6E are cross-sectional views showing a method for manufacturing a circuit device of the preferred embodiment of the present invention.

First, with reference to FIG. 6A, a first conductive foil 32 is prepared, and a resist 37 is patterned on the surface thereof. As the first conductive foil 32, a material mainly made of copper or a material mainly made of Fe—Ni or Al can be used. A thickness of the first conductive foil 32 varies depending on a thickness of the first wiring layer 22 to be formed. In a wiring layer having conductive patterns with different thicknesses, if a thickness of a conductive pattern formed to be thick is about several hundred μm, the first conductive foil 32 having a thickness equal to or more than the thickness described above is adopted. The first wiring layer 22 is formed of the first conductive pattern 22A and the second conductive pattern 22B formed to be thicker than the first conductive pattern 22A. The resist 37 covers a spot where the second conductive pattern 22B is formed.

Figure 6B:
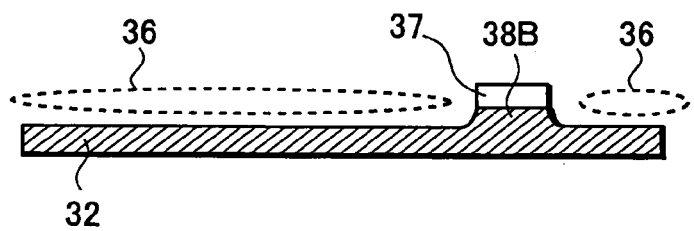

With reference to FIG. 6B, next, wet etching is performed by use of the resist 37 as an etching mask, and a principal surface where the resist 37 is not formed is etched. By this etching, the surface of the first conductive foil 32 in a region which is not covered with the resist 37 is etched to form a concave part 36. By this step, the portion covered with the resist 37 becomes a convex part 38B which is protruded in a convex shape. After this step is finished, the resist 37 is removed.

Figure 6C:
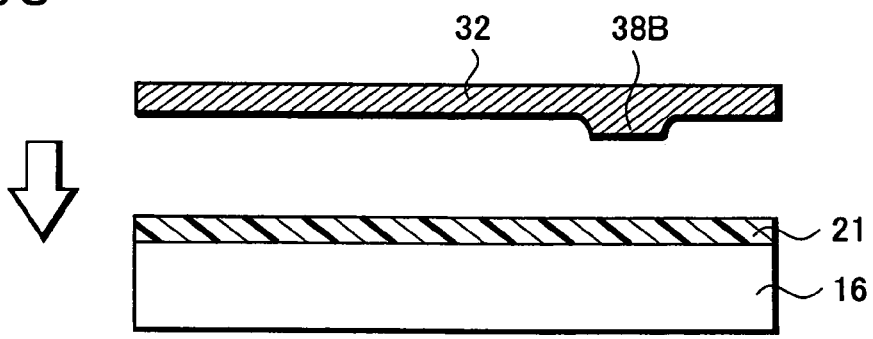
Figure 6D:
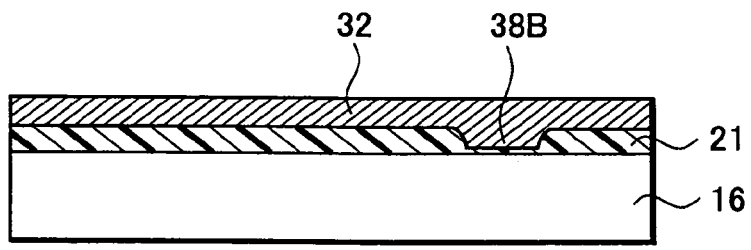

With reference to FIGS. 6C and 6D, the circuit board 16 having the first insulating layer 21 provided on its surface and the first conductive foil 32 are attached to each other. To be more specific, the first conductive foil 32 is attached to the circuit board 16 so as to bury the convex part 38B in the first insulating layer 21. If this attachment is performed by vacuum pressing, it is possible to prevent a void caused by air between the first conductive foil 32 and the first insulating layer 21. Moreover, the sides of the convex part 38B formed by isotropic etching has a smooth curved surface. Therefore, when the first conductive foil 32 is press-fitted to the first insulating layer 21, a resin seeps in along this curved surface, and there is no longer a space that is not filled with the resin. Thus, the shape of the side of the convex part 38B as described above can also prevent occurrence of the void. Furthermore, by burying the convex part 38B in the first insulating layer 21, adhesion strength between the first conductive foil 32 and the first insulating layer 21 can be improved.

Furthermore, since the surface of the conductive foil shown in FIG. 6C (the rear surface in FIG. 6B) is flat, the entire surface can come into contact with a contact surface that is a press fitting jig. Thus, pressure can be evenly applied to the entire surface.

Figure 6E:
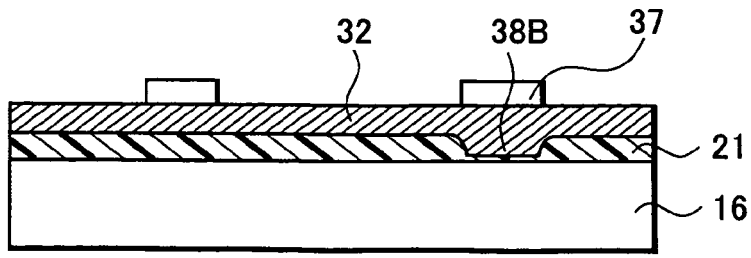

With reference to FIG. 6E, the resist 37 is patterned on the surface of the first conductive foil 32. Here, the resist 37 covers the spot where the second conductive pattern 22B is formed.

Figure 7A:
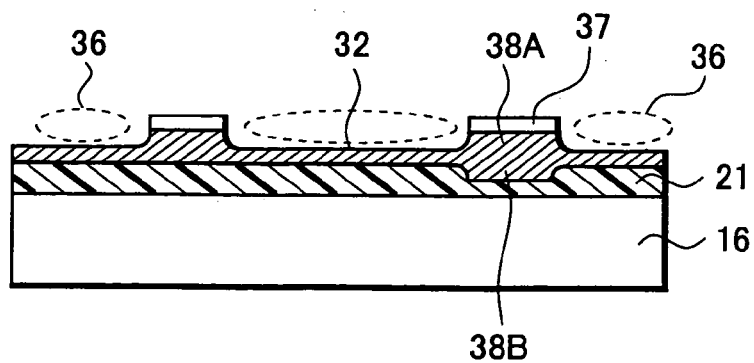
FIGS. 7A to 7D are cross-sectional views showing the method for manufacturing a circuit device of the preferred embodiment of the present invention.

With reference to FIG. 7A, wet etching is performed by use of the resist 37 as an etching mask, and a principal surface where the resist 37 is not formed is etched. By this etching, the surface of the first conductive foil 32 in a region which is not covered with the resist 37 is etched to form the concave part 36. By this step, the portion covered with the resist 37 becomes the convex part 38A which is protruded in a convex shape. After this step is finished, the resist 37 is removed. Here, a region where the first conductive pattern 22A is formed is formed to be thin enough to enable minute patterning. To be more specific, a thickness of the concave part 36 of the first conductive foil 32 is set as thin as about 9 μm to 80 μm.

Figure 7B:
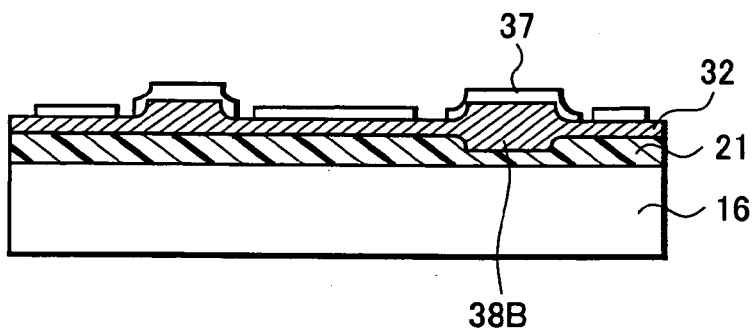
Figure 7C:
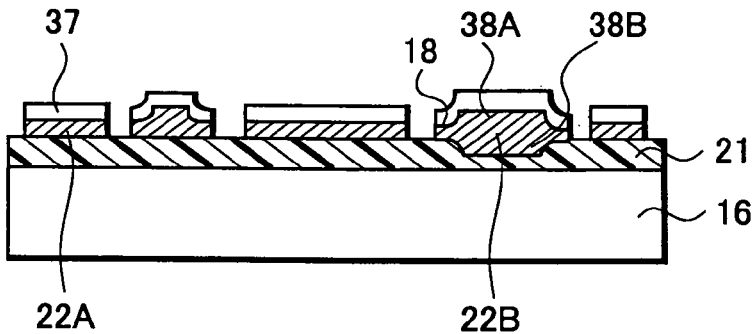

With reference to FIGS. 7B and 7C, next, the first conductive foil 32 attached to the circuit board 16 is patterned. To be more specific, the resist 37 corresponding to shapes of the first and second conductive patterns to be formed is formed. Thereafter, patterning is performed by wet etching. Here, the resist 37 which covers the first conductive foil 32 in the region corresponding to the second conductive pattern 22B is formed to be wider than the convex part 38A. This is because etching may be performed in a thin portion in order to perform patterning in one time of etching. Moreover, considering displacement of a mask, the patterns can be completely separated if patterning is performed so as to form some edge. This is because sides of the conductive patterns formed are formed into a taper shape by wet etching which is basically isotropically performed.

Figure 7D:
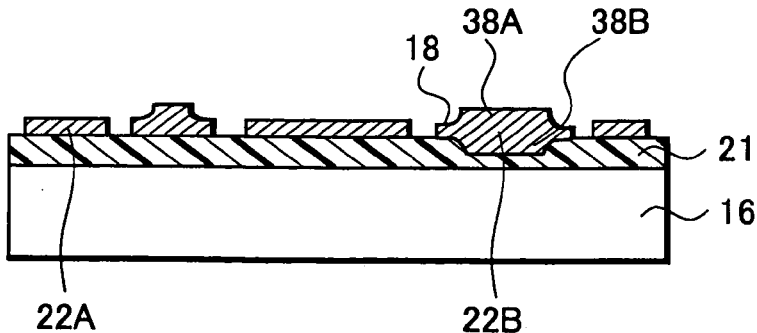

With reference to FIG. 7D, the first wiring layer 22 after etching is performed by means of the resist 37 is formed. Cross sections of the first and the second conductive patterns 22A and 22B will be described. The first conductive foil 32 in the region where the concave part 36 is formed is as thin as about several ten μm. Therefore, the first conductive pattern 22A can be minutely formed.

As described above, the edge 18 is a part formed so as to be protruded from the region where the convex part 38 is formed. Therefore, the edge 18 is formed so as to planarly surround the convex part 38. In other words, the edge 18 is formed by slightly widely forming the resist 37. Thus, stable etching can be performed by widely forming the resist 37 when the second conductive pattern 22B is formed by etching. Specifically, since wet etching is isotropic, the conductive patterns are side-etched, and the side of the patterned second conductive pattern 22B is formed into a taper shape. Therefore, by widely performing etching as described above, it is possible to prevent corrosion of the second conductive pattern 22B due to side etching.

Specifically, the thickness is secured to allow a large current to flow in order to improve heat release properties. However, if the thick portion is corroded, a function as a heat sink of the convex part or as an electrode is lowered. Moreover, since the resist 37 is formed while including some errors, corrosion of the convex part 38 attributable to these errors can be prevented according to the foregoing configuration.

Figure 8A:
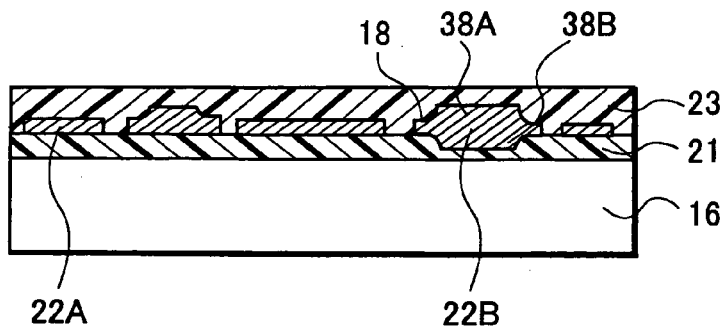
FIGS. 8A to 8D are cross-sectional views showing the method for manufacturing a circuit device of the preferred embodiment of the present invention.

With reference to FIG. 8A, the second insulating layer 23 is applied so as to cover the first and the second conductive patterns 22A and 22B. The second insulating layer 23 can be formed by use of a method for attaching a sheet-like resin film by vacuum pressing. Moreover, the second insulating layer 23 can also be formed by applying a liquid resin.

Figure 8B:
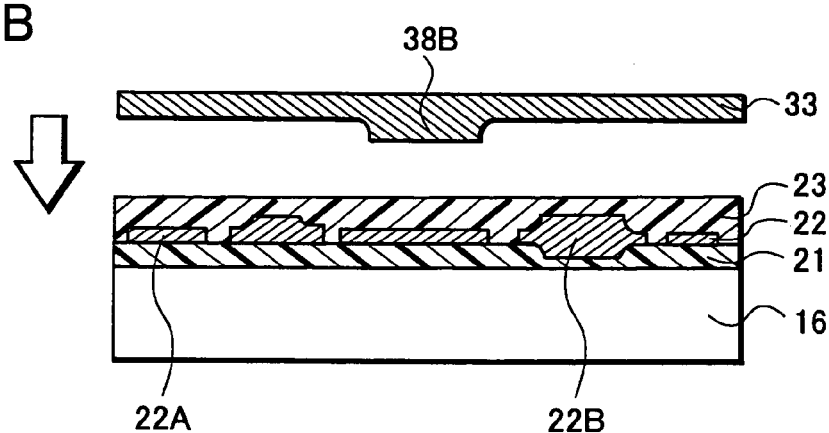
Figure 8C:
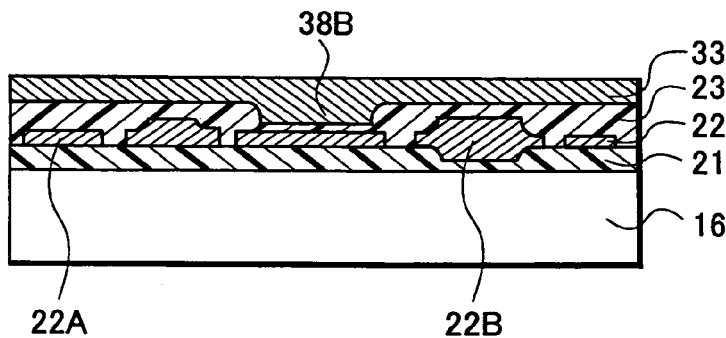

With reference to FIGS. 8B and 8C, a second conductive foil 33 is attached to the upper surface of the second insulating layer 23. In the above description, the second insulating layer 23 and the second conductive foil 33 are separately formed. However, the second conductive foil 33 having the second insulating layer 23 attached to its rear surface may be attached so as to cover the first and the second conductive patterns 22A and 22B. Moreover, it is also possible to secure a thickness by adopting a conductive foil having upper and lower convex parts as the second conductive foil 33, and by burying the lower convex part in the second insulating layer 23. In a case where conductive patterns are formed of such a conductive foil, the surface of a second conductive pattern formed to be thicker than a first conductive pattern is positioned higher than the surface of the first conductive pattern. Moreover, the rear surface of the second conductive pattern is positioned lower than the rear surface of the first conductive pattern.

Next, the connection part 20 is formed, which electrically connects the first wiring layer 22 to the second conductive foil 33.

Figure 8D:
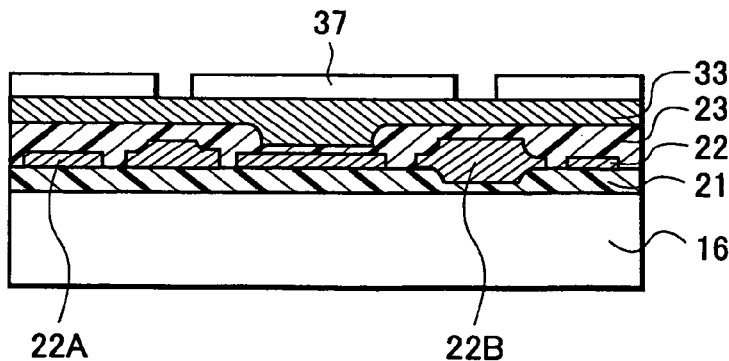

With reference to FIG. 8D, the resist 37 is patterned on the second conductive foil 33 so as to expose a region where the connection part 20 will be formed.

Figure 9A:
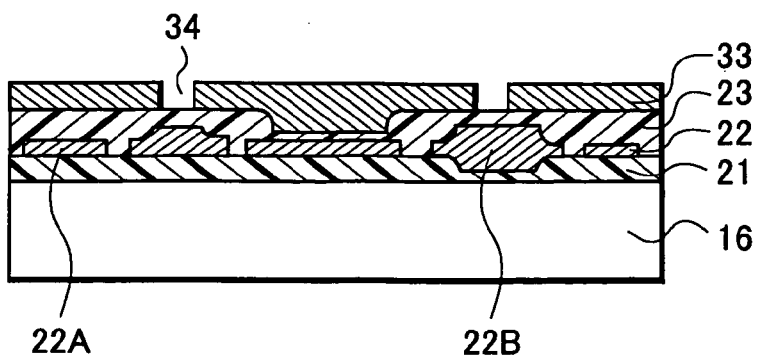
FIGS. 9A to 9D are cross-sectional views showing the method for manufacturing a circuit device of the preferred embodiment of the present invention.

With reference to FIG. 9A, a through-hole 34 is formed by partially removing the second conductive foil 33 in the region where the connection part 20 will be formed. The through-hole 34 can be formed by wet etching using an etching mask.

Figure 9B:
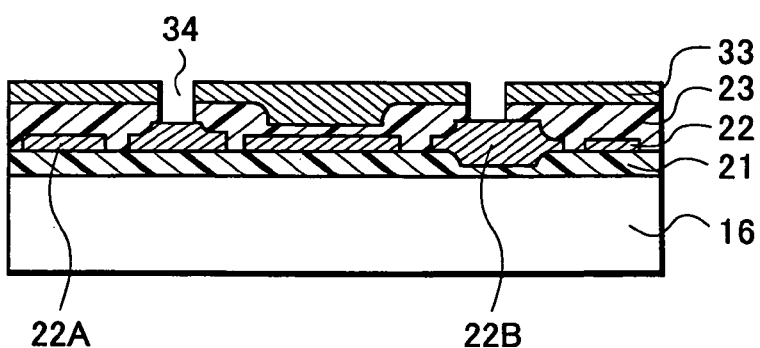

With reference to FIG. 9B, the second insulating layer 23 exposed from the through-hole 34 is removed by use of a removal method such as a laser. The removal of the exposed second insulating layer 23 can be performed by irradiating a carbon dioxide gas laser or an excimer laser. By this step, the surface of the first wiring layer 22 is exposed in the lowest portion of the through-hole 34.

Figure 9C:
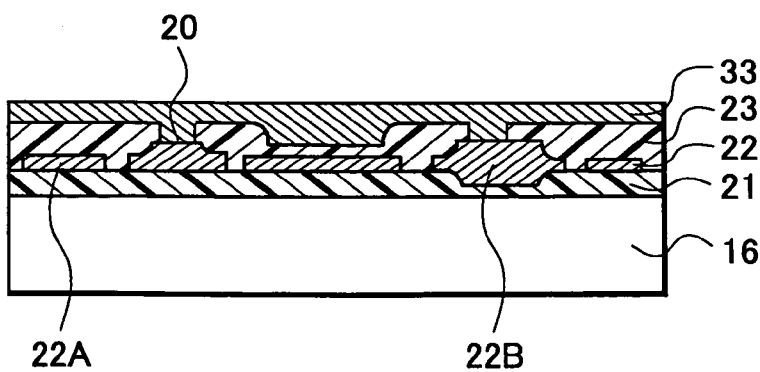

With reference to FIG. 9C, the connection part 20 is formed by forming a conductive foil on the surface of the second conductive foil 33 including the through-hole 34. The connection part 20 is formed by electrolytic plating, electroless plating or a method combining the both. As a specific method for forming the connection part 20, first, a metal film (for example, copper) having a thickness of about 2 μm is formed by electroless plating on the entire surface of the second conductive foil 33 including at least the through-hole 34. Subsequently, by electrolytic plating, a metal film having a thickness of about 20 μm is plated. Accordingly, the through-hole 34 is filled with the metal film, and the connection part 20 is formed. Note that it is also possible to selectively fill up only the through-hole 34 by filling plating. Moreover, for the plated film, Au, Ag, Pd and the like may be adopted. Furthermore, partial plating may be performed by use of a mask.

Figure 9D:
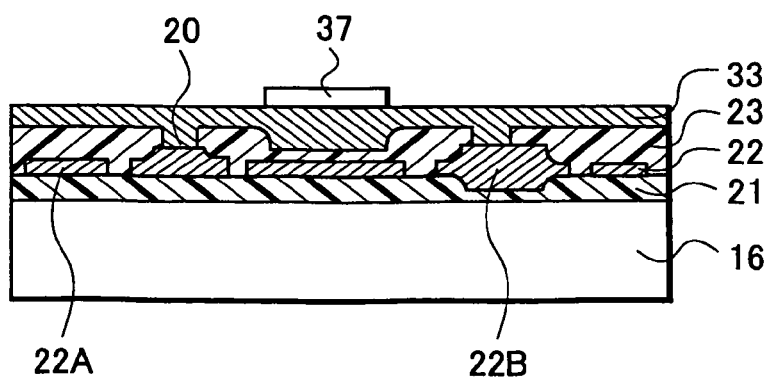
Figure 10A:
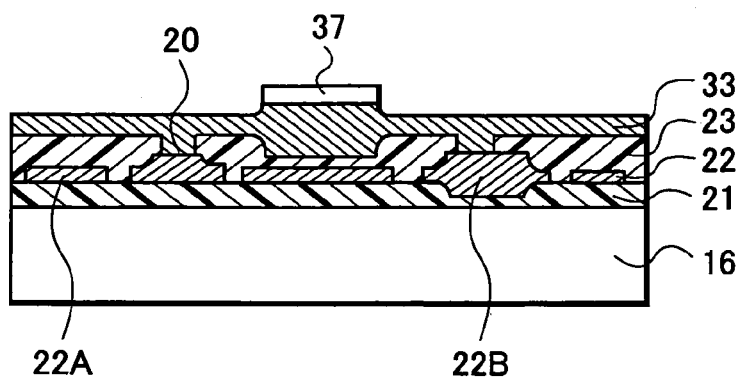
FIGS. 10A to 10D are cross-sectional views showing the method for manufacturing a circuit device of the preferred embodiment of the present invention.

With reference to FIGS. 9D and 10A, after the region where the second conductive pattern is formed is covered with the resist 37, the etching of the surface of the second conductive foil 33 is performed. By this etching, the region where the thin first conductive pattern 24A is formed is sufficiently thinned. After the etching is finished, the resist 37 is removed.

Figure 10B:
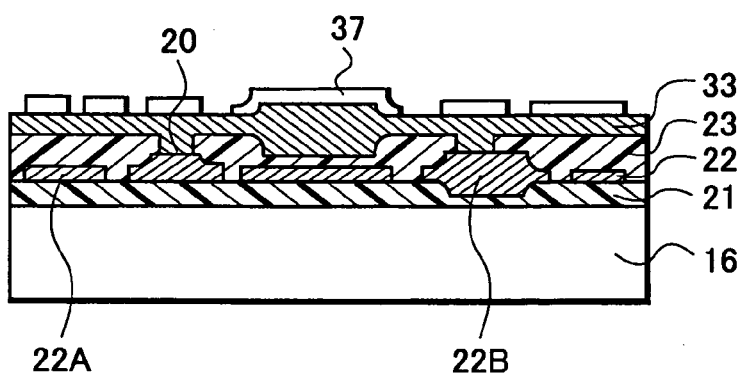

With reference to FIG. 10B, next, after the new resist 37 is applied onto the surface of the second conductive foil 33, the resist 37 is patterned so as to form the first conductive pattern 24A and the second conductive pattern 24B. Here, the resist 37 which covers the convex part 38 also covers an area wider than the convex part 38 so as to form the edge 18 as described above. Specifically, the resist 37 is applied so as to extend to a thin portion from the sides of the convex part 38.

Figure 10C:
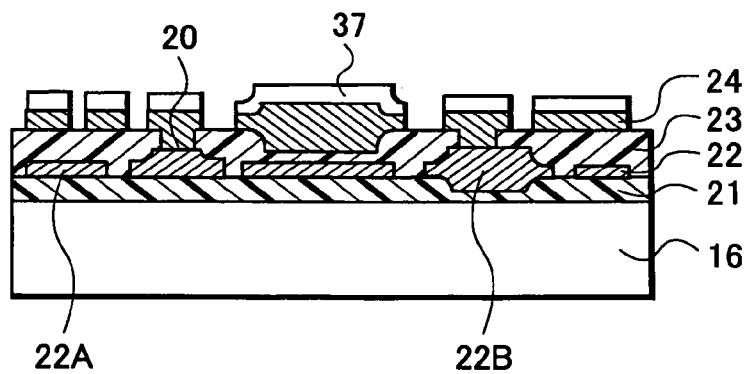
Figure 10D:
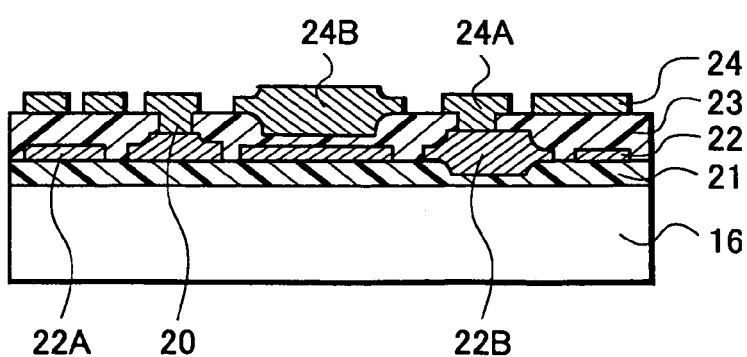

With reference to FIGS. 10C and 10D, next, by etching the second conductive foil 33 through the resist 37, the first and the second conductive patterns 24A and 24B are formed. Since the edge 18 is formed, stable etching can be performed. After this etching is finished, the resist 37 is removed.

Figure 11A:
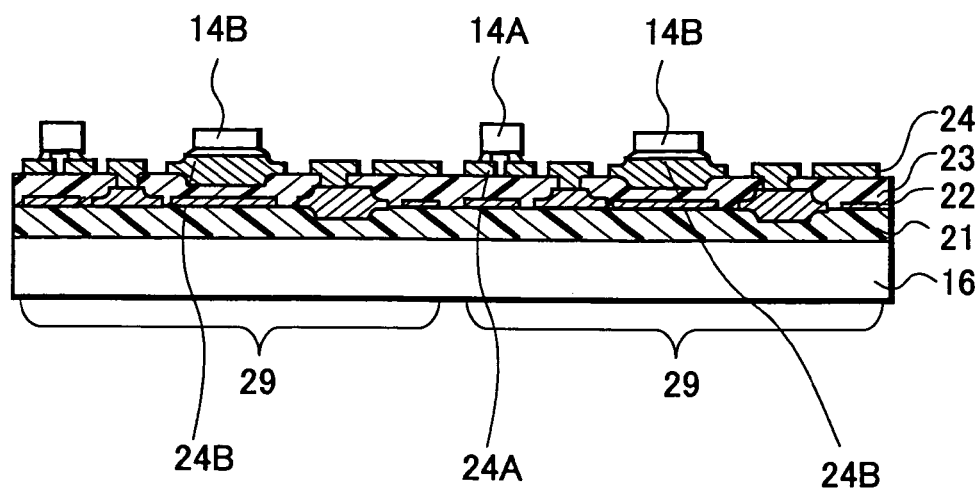
FIGS. 11A and 11B are cross-sectional views showing the method for manufacturing a circuit device of the preferred embodiment of the present invention.

With reference to FIG. 11A, the circuit elements 14 are fixed to the conductive patterns (islands) by use of solder, a conductive paste or the like. Here, the circuit element 14A which performs processing of a small current is fixed to the first conductive pattern 24A. Meanwhile, the circuit element 14B through which a large current flows or from which a large amount of heat is generated is fixed to the second conductive pattern 24B. Since the first conductive pattern 24A can form a minute pattern, an element having a number of terminals such as an LSI element can be employed as the circuit element 14A. Since the second conductive pattern 24B is formed to be sufficiently thick, a power transistor which performs processing of a large current, an LSI, and the like can be employed as the circuit element 14B. Here, units 29 which form one circuit device are formed on one piece of the circuit board 16. The units 29 can be collectively die-bonded and wire-bonded. Although, here, active elements are mounted face up, the elements may be mounted face down if necessary.

Figure 11B:
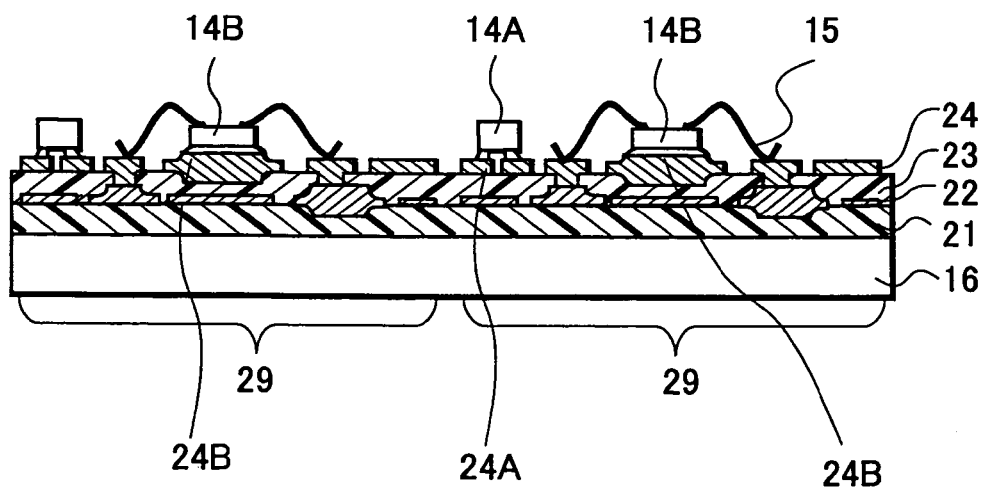

With reference to FIG. 11B, the circuit elements 14 and the conductive patterns are electrically connected to each other through the thin metal wires 15. In this embodiment, a plurality of thermal vias are formed below the thickly formed second conductive pattern 24B, and the thermal vias are electrically connected to the lower conductive pattern.

Thus, without thickly forming the second conductive pattern 24B, the securing of a large current capacity and improvement in heat release properties can be realized at the same time. Accordingly, the upper surfaces of the first and the second conductive patterns 24A and 24B can be formed at the same height, and thin wires of about several ten μm can be used in performing electrical connection of the circuit element 14B. In a conventional case, there is a large difference in height between conductive patterns and transistors mounted above a heat sink and the like. Thus, in order for wires not to hang down by its own weight and not to short-circuit a chip or the heat sink, firm thick wires are used. However, since a thick portion corresponding to the heat sink and a thin pattern are disposed on the same plane, it is not required to use the firm thick wires. Here, the thin wires generally mean thin metal wires having a diameter of about 80 μm.

After the foregoing step is finished, the units 29 are separated from each other. The respective units can be separated by punching using a press machine, dicing or the like. Thereafter, the leads 11 are fixed to the circuit boards 16 of the respective units.

Figure 12:
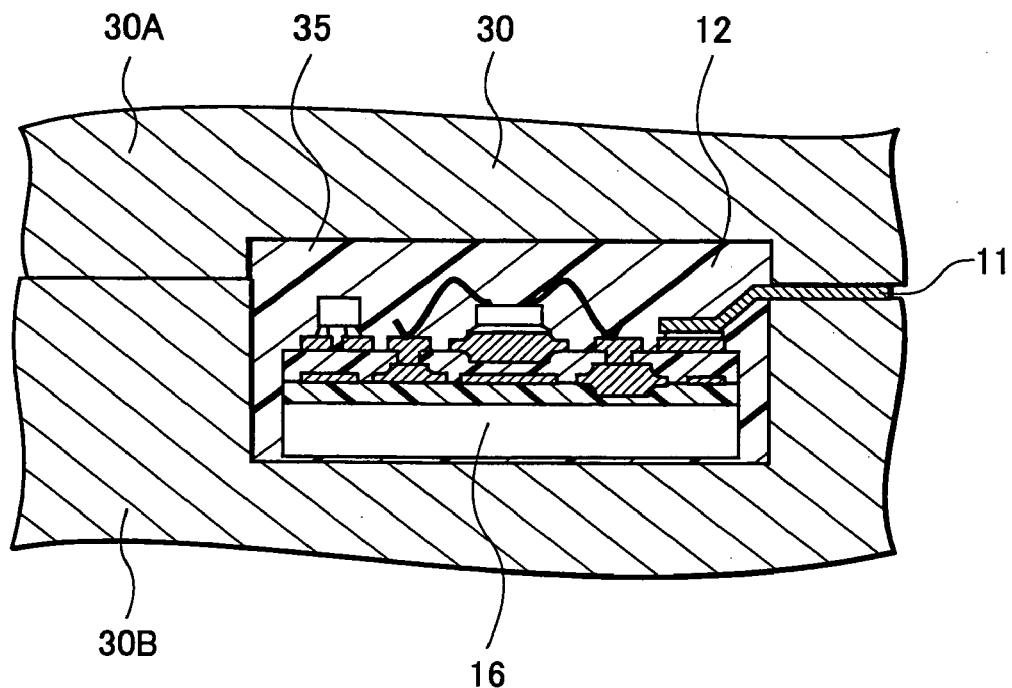
FIG. 12 is a cross-sectional view showing the method for manufacturing a circuit device of the preferred embodiment of the present invention.

With reference to FIG. 12, resin sealing for the each circuit board 16 is performed. Here, the resin sealing is performed by transfer molding using a thermosetting resin. Specifically, after the circuit board 16 is housed in a mold 30 formed of an upper mold 30A and a lower mold 30B, the both molds are engaged with each other to fix the leads 11. Thereafter, the resin sealing step is performed by injecting a resin into a cavity 35. By the steps described above, the circuit device as shown in FIGS. 1A to 1C is manufactured.

As described above, on the conventional hybrid integrated circuit board, since all conductive patterns are formed to have the same thickness, a wide pattern is formed or a heat sink is additionally employed in a portion which requires a large current. However, in the present application, a thick pattern and a thin pattern can be formed on the same hybrid integrated circuit board. Thus, a thick portion is used for improving heat release properties and for allowing a large current to flow. Moreover, small signal components can be mounted on a thin portion. Furthermore, multiple layers of wirings enable densification of a circuit. Thus, miniaturization of a hybrid integrated circuit can be realized.

For example, in the case of using a metal board such as Al, normally, excellent heat release properties are achieved. Meanwhile, as described above, if thick and thin patterns are formed, and a convex part of the thick pattern is buried in an insulating resin, heat from the convex part is transmitted to the board through the insulating resin. Moreover, if fillers are contained in the insulating resin, the heat release properties are further improved.

In the above description of the manufacturing method, the thin first conductive pattern and the thick second conductive pattern are formed in each of the first and the second wiring layers 22 and 24. However, it is also possible to form the thick second conductive pattern only in any one of the respective layers. In such a case, by omitting some of the manufacturing steps described above, circuit devices of other configurations can be formed. To be more specific, the circuit device 10A can be formed by omitting the steps of forming the convex part 38B of the first wiring layer 22, and the convex parts 38A and 38B of the second wiring layer 24. Moreover, the circuit device 10B can be formed by omitting the steps of forming the convex part 38A of the first wiring layer 22, and the convex parts 38A and 38B of the second wiring layer 24.

In addition, the circuit device 10C can be formed by omitting the step of forming the convex parts 38A and 38B of the second wiring layer 24. Moreover, the circuit device 10D can be formed by omitting the step of forming the convex parts 38A and 38B of the second wiring layer 24. Furthermore, the circuit device 10E can be formed by omitting the steps of forming the convex parts 38A and 38B of the first wiring layer 22, and the convex part 38B of the second wiring layer 24.

Moreover, the circuit device 10F can be formed by omitting the steps of forming the convex parts 38A and 38B of the first wiring layer 22, and the convex part 38A of the second wiring layer 24. Furthermore, the circuit device 10E can be formed by omitting the step of forming the convex parts 38A and 38B of the first wiring layer 22.

<Second Embodiment>

Figure 13A:
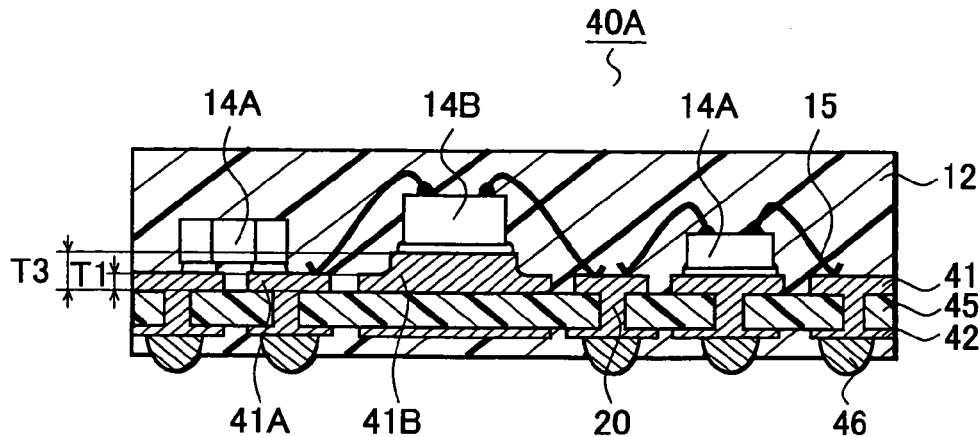
FIGS. 13A to 13C are cross-sectional views showing circuit devices of the preferred embodiment of the present invention.
Figure 13B:
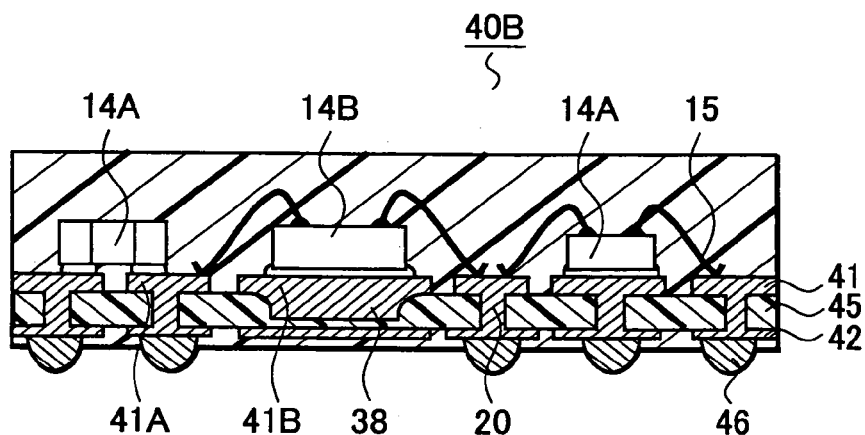
Figure 13C:
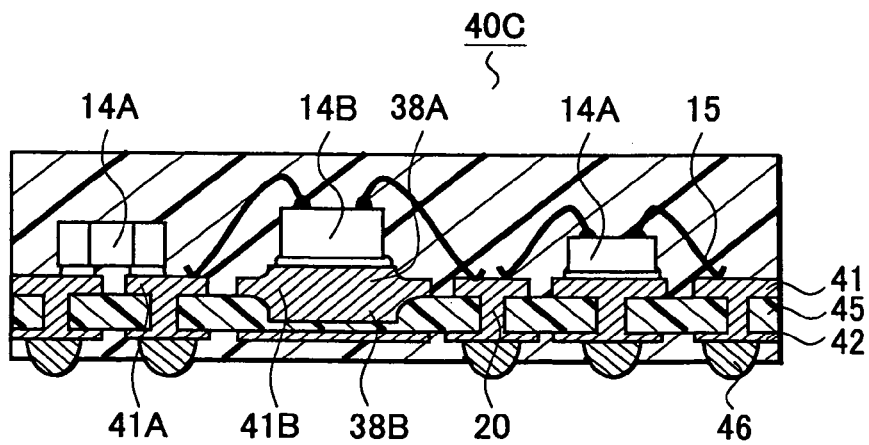

With reference to FIGS. 13A to 13C, a circuit device 40 of this embodiment will be described. Each of FIGS. 13A to 13C is a cross-sectional view of the circuit device of this embodiment.

With reference to FIG. 13A, a multilayer wiring structure including two wiring layers is formed in a circuit device 40A. A first wiring layer 41 of an upper layer is formed of a first conductive pattern 41A and a second conductive pattern 41B formed to be thicker than the first conductive pattern 41A. The rear surfaces of the first and the second conductive patterns 41A and 41B are disposed at substantially the same level. In addition, a convex part 38 is formed so as to position the surface of the second conductive pattern 41B higher than the surface of the first conductive pattern 41A. First, a thickness of the first conductive pattern 41A is set to a T1, and a thickness of the second conductive pattern 41B is set to a T3. The T1 may be set to about 9 μm to 80 μm in order to minutely form the first conductive pattern 41A. The second conductive pattern 41B may have a thickness of about 35 μm to 500 μm in order to secure a current capacity.

A circuit element 14A is a circuit element through which a relatively small current flows, and is connected to the first conductive pattern 41A. Moreover, a circuit element 14B through which a large current flows is connected to the second conductive pattern 41B. Furthermore, by increasing a contact area between the second conductive pattern 41B and an insulating layer 45, heat release properties are improved. Although a second wiring layer 42 mainly forms external electrodes, the layer can form a wiring pattern according to need. Thus, a degree of freedom of wirings is significantly increased, and the wirings can be densified. Moreover, a part of the second wiring layer 42 is used as a dummy pattern and disposed immediately below the second conductive pattern 41B. Thus, the heat release properties can be further improved.

A connection part 20 is a part which electrically connects the upper first wiring layer 41 and the lower second wiring layer 42 in a desired spot. A concrete structure of the connection part 20 can be set the same as that described with reference to FIG. 2B.

Moreover, a sealing resin 12 seals the surface of the first wiring layer 41 by covering a circuit elements 14 and thin metal wires 15. The entire circuit device 40A is mechanically supported by the sealing resin 12.

With reference to FIGS. 13B, 13C, and 14A to 14C, circuit devices of other configurations will be described. Note that basic configurations of the respective circuit devices are the same as that of the circuit device 40A.

With reference to FIG. 13B, a circuit device 40B will be described. Here, the first wiring layer 41 is formed of the first conductive pattern 41A and the second conductive pattern 41B formed to be thicker than the first conductive pattern 41A. The surfaces of the first and the second conductive patterns 41A and 41B are disposed at substantially the same level. In addition, the convex part 38 is formed so as to position the rear surface of the second conductive pattern 41B lower than the rear surface of the first conductive pattern 41A. Therefore, a cross-sectional area of the second conductive pattern 41B is increased, and a large current capacity can be secured. Moreover, an increased thickness enables reduction in a transient thermal resistance. Furthermore, the upper surfaces of the first and the second conductive patterns 41A and 41B are positioned on substantially the same plane. Therefore, disposition of the circuit element 14 and installation of the thin metal wires 15 are facilitated. Moreover, the first conductive pattern 41A and the second wiring layer 42 come close to each other by providing the convex part 38. Thus, heat release properties are improved. Furthermore, a part of the second wiring layer 42 is used as a dummy pattern and disposed immediately below the second conductive pattern 41B. Thus, the heat release properties can be further improved. Furthermore, the convex part 38 is formed in the rear surface of the second conductive pattern 41B, and the surface thereof is positioned on the same plane as that of the first conductive pattern 41A. The convex part 38 formed in the rear surface of the second conductive pattern 41B is buried in the insulating layer 45. Accordingly, the second conductive pattern 41B can be formed to be thick without affecting a thickness of the circuit device. Thus, the entire circuit device can be miniaturized.

With reference to FIG. 13C, a circuit device 40C will be described. Here, a pattern having the circuit element 14B mounted thereon is protruded upward and downward in a thickness direction. Thus, the second conductive pattern 41B formed to be partially thick is formed. Therefore, a cross-sectional area of the second conductive pattern 41B is further increased, and a larger current capacity can be secured. Moreover, an increased thickness enables significant reduction in a transient thermal resistance. Moreover, since a convex part 38B is buried in the insulating layer 45, the convex part 38B and the second wiring layer 42 come close to each other. Thus, heat release properties are improved. Furthermore, by adjusting thicknesses of a convex part 38A and the convex part 38B, conductive patterns according to characteristics of circuit elements can be formed.

Figure 14A:
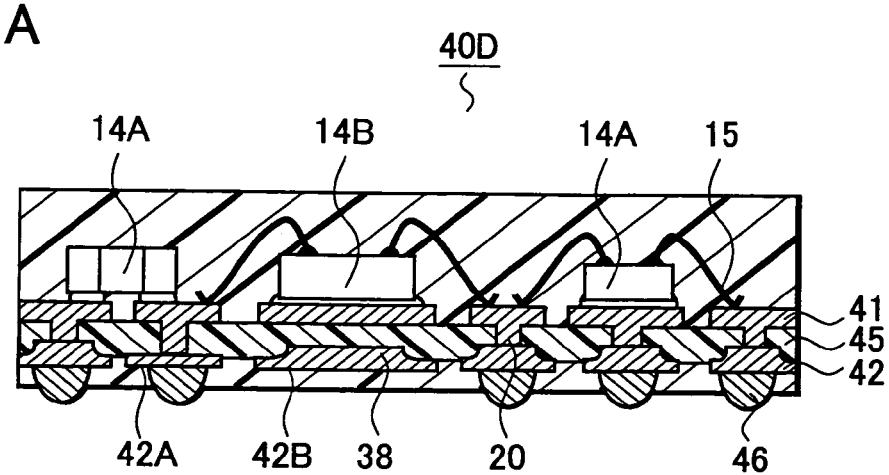
FIGS. 14A to 14C are cross-sectional views showing circuit devices of the preferred embodiment of the present invention.

With reference to FIG. 14A, a circuit device 40D will be described. Here, the convex part 38 protruded upward is provided in the lower second wiring layer 42, and a second conductive pattern 42B is formed. Therefore, since the first wiring layer 41 and the second conductive pattern 42B come close to each other, heat release properties for heat generated from the circuit elements 14 are improved. Moreover, the rear surfaces of a first conductive pattern 42A and the second conductive pattern 42B are positioned on the same plane. Therefore, external electrodes can be formed below the second conductive pattern 42B, and heat can also be released to a board on which the circuit device is mounted. Furthermore, by forming the second conductive pattern 42B as a dummy pattern, the heat release properties of the entire circuit device can be improved.

Figure 14B:
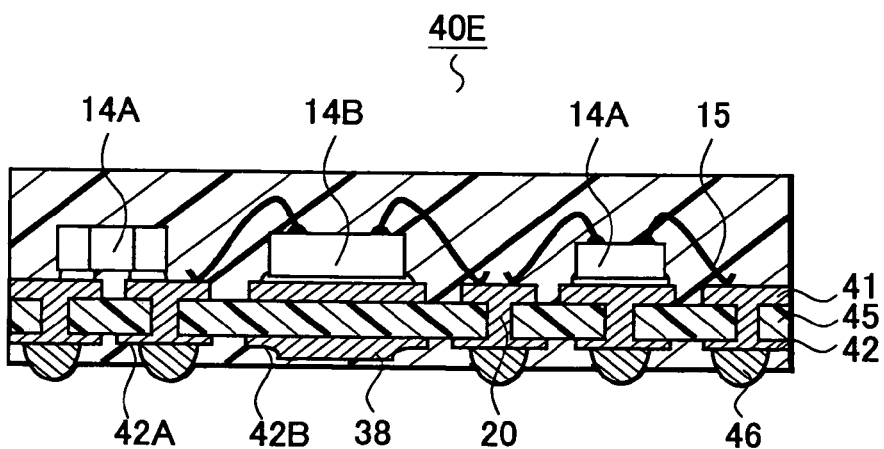

With reference to FIG. 14B, a circuit device 40E will be described. Here, by providing the convex part 38 protruded downward in the lower second wiring layer 42, the thick second conductive pattern 42B is formed. Therefore, since the second conductive pattern 42B comes close to the outside, heat release properties can be improved. Moreover, by forming external electrodes on the second conductive pattern 42B, heat generated from the circuit elements 14 can also be released to a mounting board.

Figure 14C:
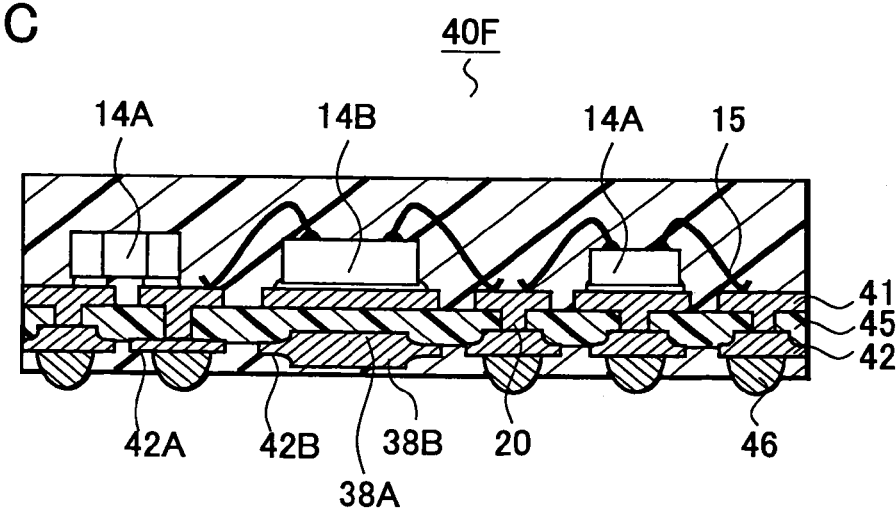

With reference to FIG. 14C, a circuit device 40F will be described. Here, by providing the convex part 38 so as to be protruded both upward and downward in the lower second wiring layer 42, the second conductive pattern 42B is formed. Therefore, a cross-sectional area of the second conductive pattern 42B can be further increased, and heat release properties can be further improved.

Next, with reference to FIGS. 15 to 19, a method for manufacturing a circuit device of this embodiment will be described.

With reference to FIGS. 15 and 16, a description will be given of the steps of preparing a first conductive foil 50 and a second conductive foil 51, applying a resist to each of the first and the second conductive foils 50 and 51, and forming convex parts in the conductive foils by etching.

Figure 15A:
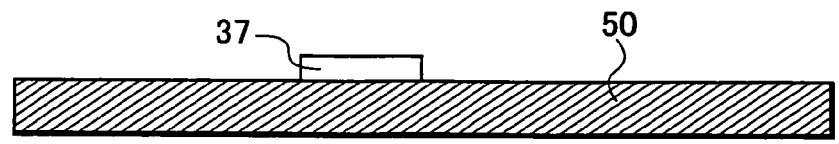
FIGS. 15A and 15B are cross-sectional views showing a method for manufacturing a circuit device of the preferred embodiment of the present invention.

With reference to FIG. 15A, the first conductive foil 50 is prepared, and the resist 37 is patterned on the surface thereof. Here, the resist 37 covers a spot to be thickly formed. Moreover, as a material of the first conductive foil 50, a material mainly made of Cu or a publicly known lead frame material can be employed. A thickness of the first conductive foil 50 varies depending on a thickness of a wiring layer to be formed. In a wiring layer having conductive patterns with different thicknesses, if a thickness of a conductive pattern formed to be thick is about several hundred μm, the first conductive foil 50 having a thickness equal to or more than the thickness described above is adopted.

Figure 15B:
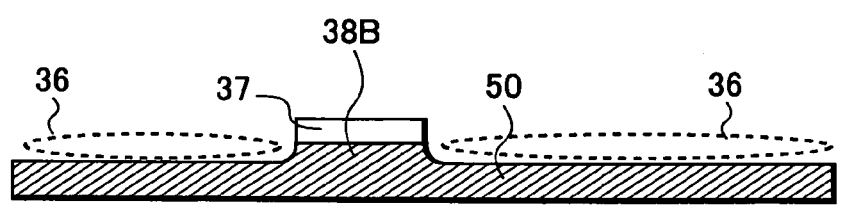

With reference to FIG. 15B, wet etching is performed by use of the resist 37 as an etching mask, and a principal surface where the resist 37 is not formed is etched. By this etching, the front and rear surfaces of the first conductive foil 50 in a region which is not covered with the resist 37 is etched to form a concave part 36. After a convex part 38B is formed in the first conductive foil 50 by etching, the resist 37 is removed.

Figure 16A:
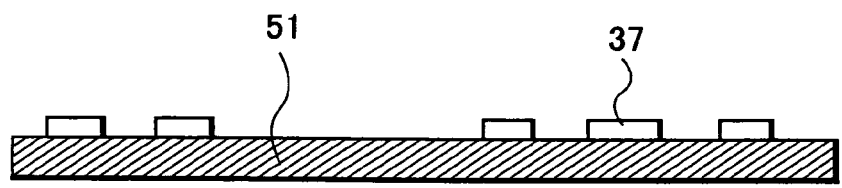
FIGS. 16A and 16B are cross-sectional views showing the method for manufacturing a circuit device of the preferred embodiment of the present invention.

With reference to FIG. 16A, the second conductive foil 51 is prepared, and the resist 37 is patterned on the surface thereof. Here, the resist 37 covers a spot to be thickly formed.

Figure 16B:
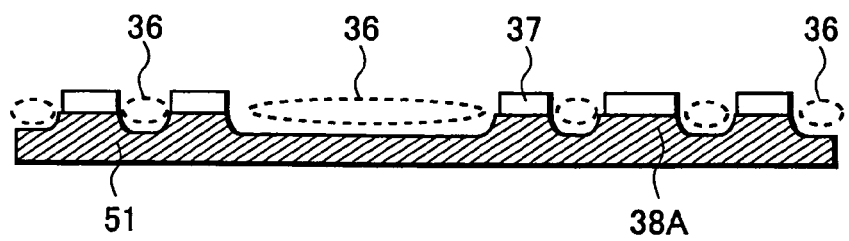

With reference to FIG. 16B, a convex part 38A is formed in the surface of the second conductive foil 51 by use of the etching method described above.

With reference to FIGS. 17 and 18, a description will be given of the step of forming a circuit board 53 by pressure bonding the first and the second conductive foils 50 and 51 to an insulating layer 52.

Figure 17A:
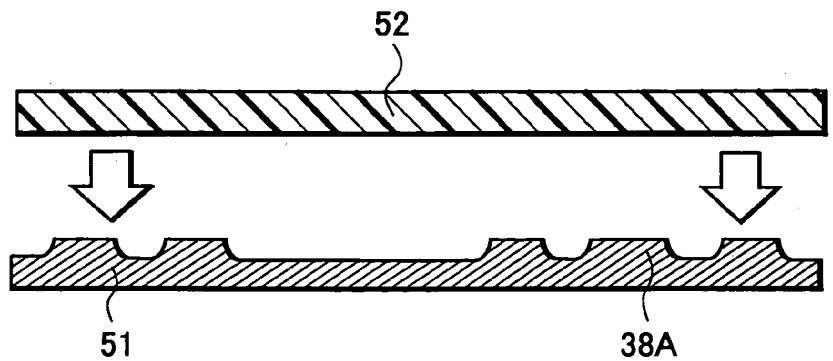
FIGS. 17A to 17D are cross-sectional views showing the method for manufacturing a circuit device of the preferred embodiment of the present invention.
Figure 17B:
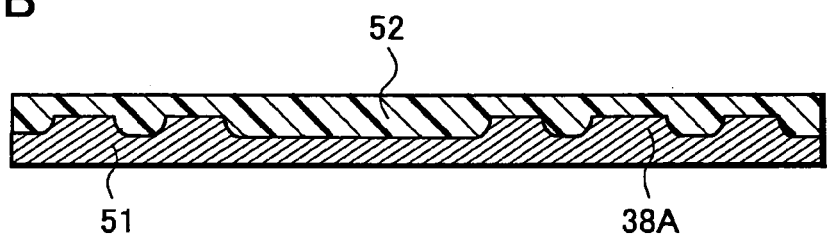

First, with reference to FIGS. 17A and 17B, the insulating layer 52 is firmly attached to the second conductive foil 51. In this event, the convex part 38A is buried in the insulating layer 52. If this attachment is performed by vacuum pressing, it is possible to prevent a void caused by air between the second conductive foil 51 and the insulating layer 52. Moreover, the sides of the convex part 38A formed by isotropic etching has a smooth curved surface. Therefore, when the second conductive foil 51 is pressure-bonded to the insulating layer 52, a resin seeps in along this curved surface, and there is no longer a space that is not filled with the resin. Thus, the shape of the side of the convex part 38A as described above can also prevent occurrence of the void. Furthermore, by burying the convex part 38A in the insulating layer 52, adhesion strength between the second conductive foil 51 and the insulating layer 52 can be improved.

Figure 17C:
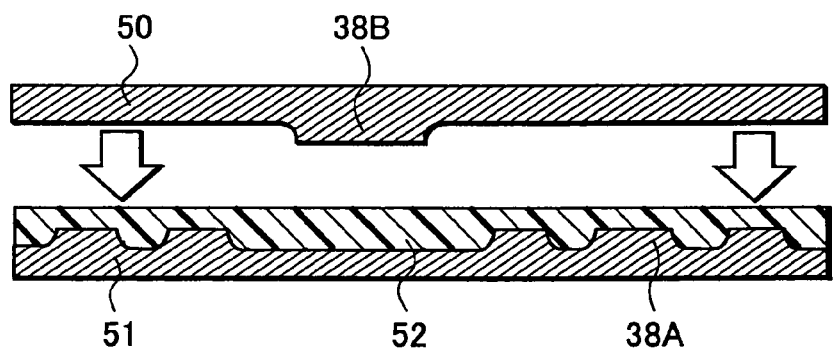
Figure 17D:
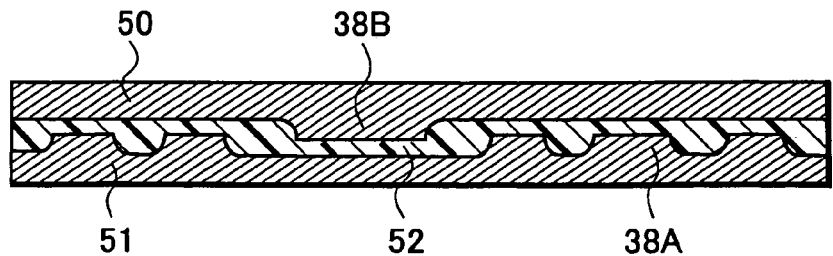

Next, with reference to FIGS. 17C and 17D, the first conductive foil 50 is attached to the insulating layer 52. In this event, the convex part 38B is buried in the insulating layer 52. Moreover, by performing the attachment by the vacuum pressing described above, it is possible to prevent a void caused by air between the first conductive foil 50 and the insulating layer 52.

Figure 18A:
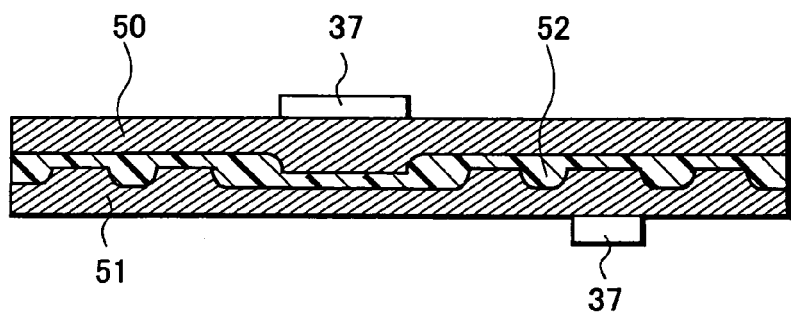
FIGS. 18A to 18C are cross-sectional views showing the method for manufacturing a circuit device of the preferred embodiment of the present invention.
Figure 18B:
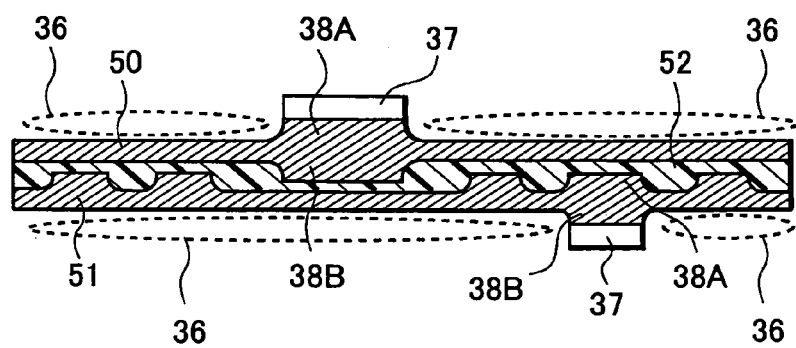
Figure 18C:
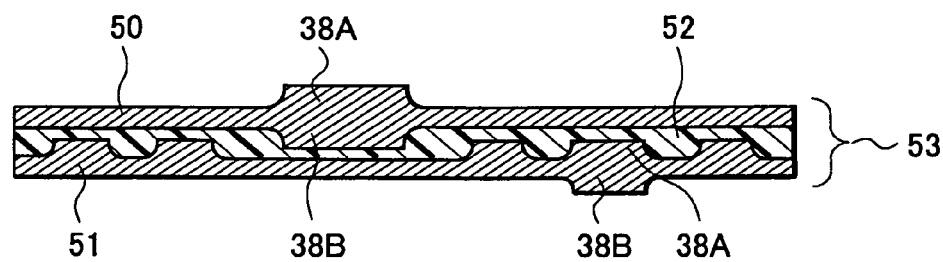

Next, with reference to FIG. 18A, the resist 37 is applied onto the first conductive foil 50. The resist 37 covers a spot where the convex part 38A of the first conductive foil 50 will be formed, and a spot where the convex part 38B of the second conductive foil 51 will be formed. With reference to FIG. 18B, wet etching is performed by use of the resist 37 as an etching mask, and a principal surface where the resist 37 is not formed is etched. By this etching, the surface of the first conductive foil 50 and the rear surface of the second conductive foil 51 in regions which are not covered with the resist 37 are etched to form the concave parts 36. With reference to FIG. 18C, after the convex parts 38 are formed in the first and the second conductive foils 50 and 51 by etching, the resist 37 is removed. Thus, the circuit board 53 is formed.

Figure 19A:
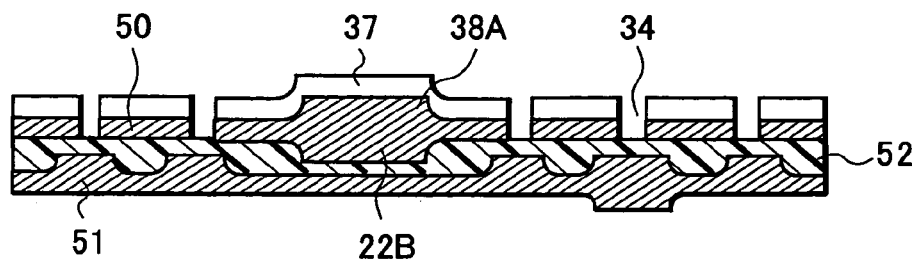
FIGS. 19A to 19C are cross-sectional views showing the method for manufacturing a circuit device of the preferred embodiment of the present invention.
Figure 19B:
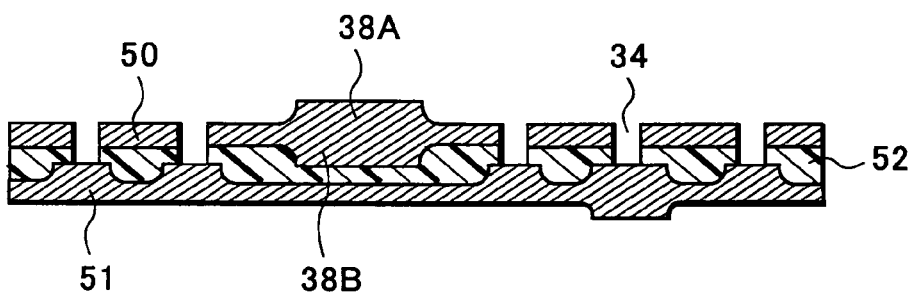
Figure 19C:
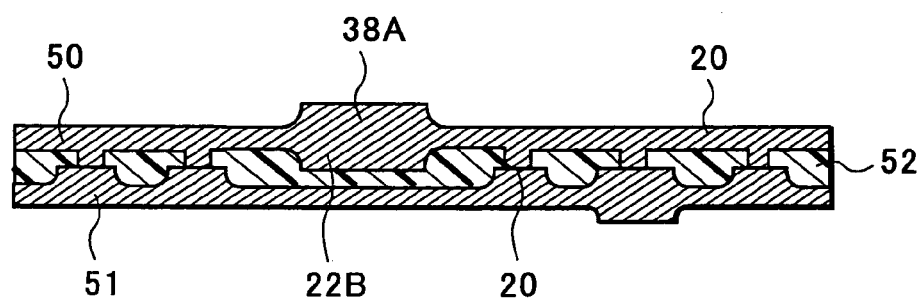

With reference to FIGS. 19A to 19C, a description will be given of the step of electrically connecting the first conductive foil 50 and the second conductive foil 51 through the connection part 20.

First, with reference to FIG. 19A, the entire surface is covered with the resist 37 so as to expose only a portion of the first conductive foil 50 where a through-hole is formed. Next, the first conductive foil 50 is etched through the resist 37. Since the first conductive foil 50 is mainly made of Cu, chemical etching is performed by use of ferric chloride or cupric chloride as an etchant. Moreover, during this etching, the second conductive foil 51 is covered with an adhesive sheet or the like and protected from the etchant. However, if the second conductive foil 51 itself is sufficiently thick and has a thickness which can maintain flatness even after etching, the second conductive foil 51 may be slightly etched.

With reference to FIG. 19B, after the resist 37 is removed, the first conductive foil 50 is used as a mask, and the insulating layer 52 immediately below a through-hole 34 is removed by use of a laser. Accordingly, the rear surface of the second conductive foil 51 is exposed in the bottom of the through-hole 34. As the laser, a carbon dioxide gas laser may be used. Moreover, if there is a residue in the bottom of an opening after an insulating resin is vaporized by the laser, this residue is removed by wet etching using sodium permanganate, ammonium persulfate, or the like.

With reference to FIG. 19C, on the entire surface of the first conductive foil 50 including the through-hole 34, a plated film that is the connection part 20 which electrically connects the second conductive foil 51 and the first conductive foil 50 is formed. This plated film is formed by electroless plating, electrolytic plating or a combination of the both.

Next, with reference to FIGS. 20A and 20B, a description will be given of the step of forming the first wiring layer 41 and the second wiring layer 42 by patterning the first conductive foil 50 and the second conductive foil 51.

Figure 20A:
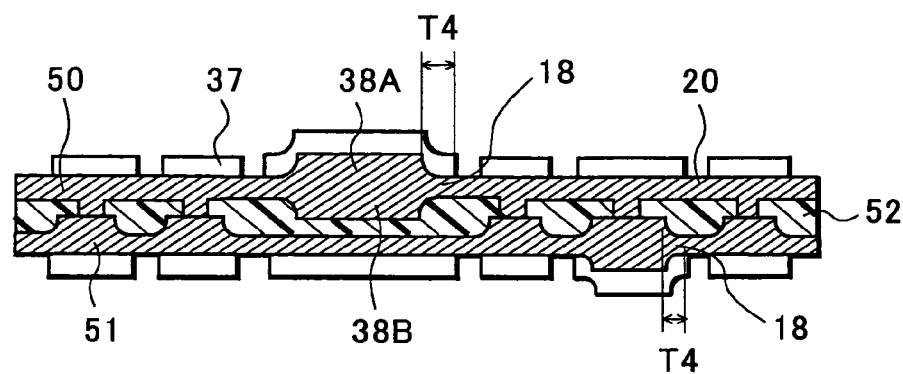
FIGS. 20A and 20B are cross-sectional views showing the method for manufacturing a circuit device of the preferred embodiment of the present invention.

With reference to FIG. 20A, the resist 37 is newly applied to the first and the second conductive foils 50 and 51. Next, the resist 37 is patterned on the first conductive foil 50 so as to form the first wiring layer 41. To be more specific, the resist 37 is patterned according to the shapes of the first and the second conductive patterns 41A and 41B to be formed. Here, the resist 37 which covers the convex part 38A also covers an area wider than the convex part 38A by a T4 so as to form the edge 18. Specifically, the resist 37 is also applied to the portion of the T4 so as to extend to a thin portion from the sides of the convex part 38A. Similarly, the new resist 37 is applied onto the second conductive foil 51 and patterned so as to form the second wiring layer 42. Here, the resist 37 which covers the second conductive foil 51 in a region corresponding to the second conductive pattern 42B is formed to be wider than the convex part 38. This is because etching may be performed in a thin portion in order to perform patterning in one time of etching. Moreover, considering displacement of a mask, the patterns can be completely separated if patterning is performed so as to form some edge. This is because the sides of the conductive patterns formed are formed into a taper shape by wet etching which is basically isotropically performed. Furthermore, the resist 37 is similarly patterned on the second conductive foil 51.

Figure 20B:
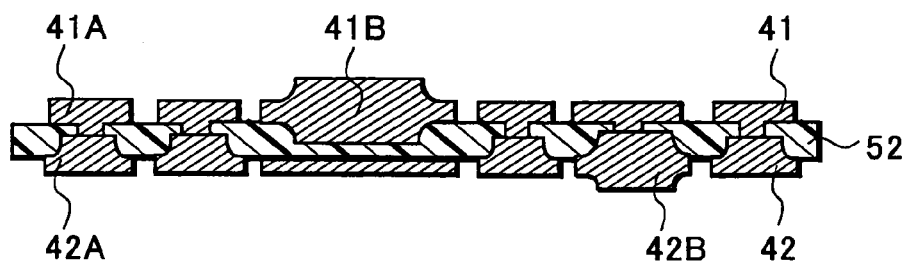

With reference to FIG. 20B, the first and the second wiring layers 41 and 42 are formed by etching the first and the second conductive foils 50 and 51 through the resist 37 formed as described above. After the etching is finished, the resist 37 is removed.

Figure 21A:
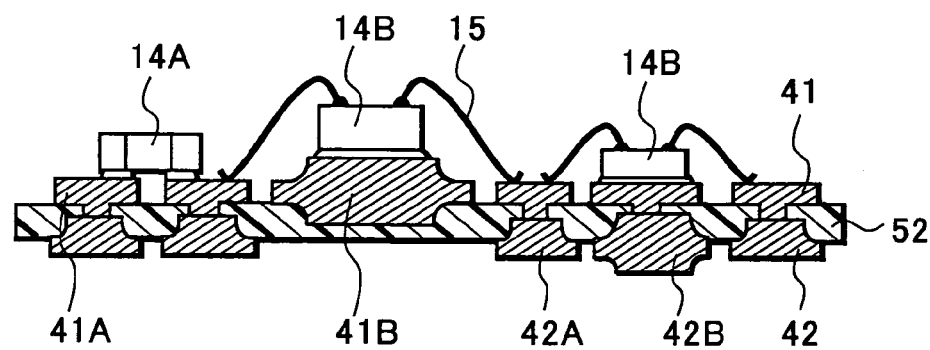
FIGS. 21A and 21B are cross-sectional views showing the method for manufacturing a circuit device of the preferred embodiment of the present invention.
Figure 21B:
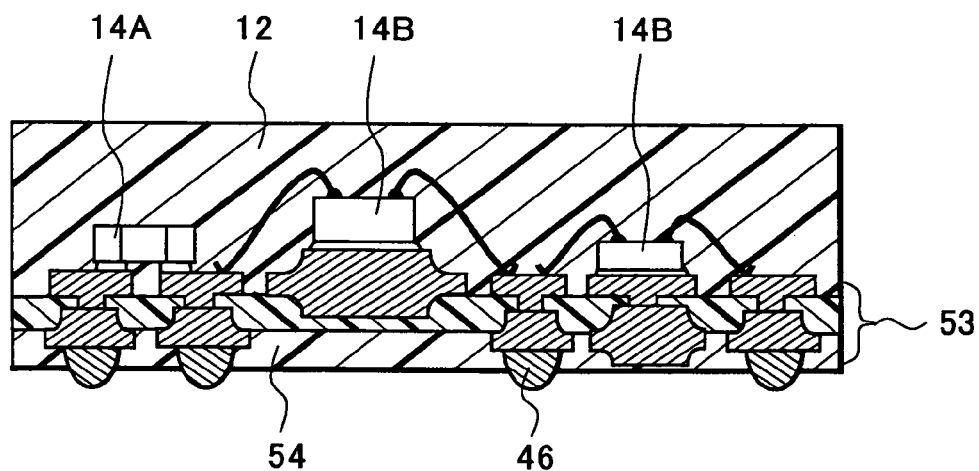
Figure 22A:
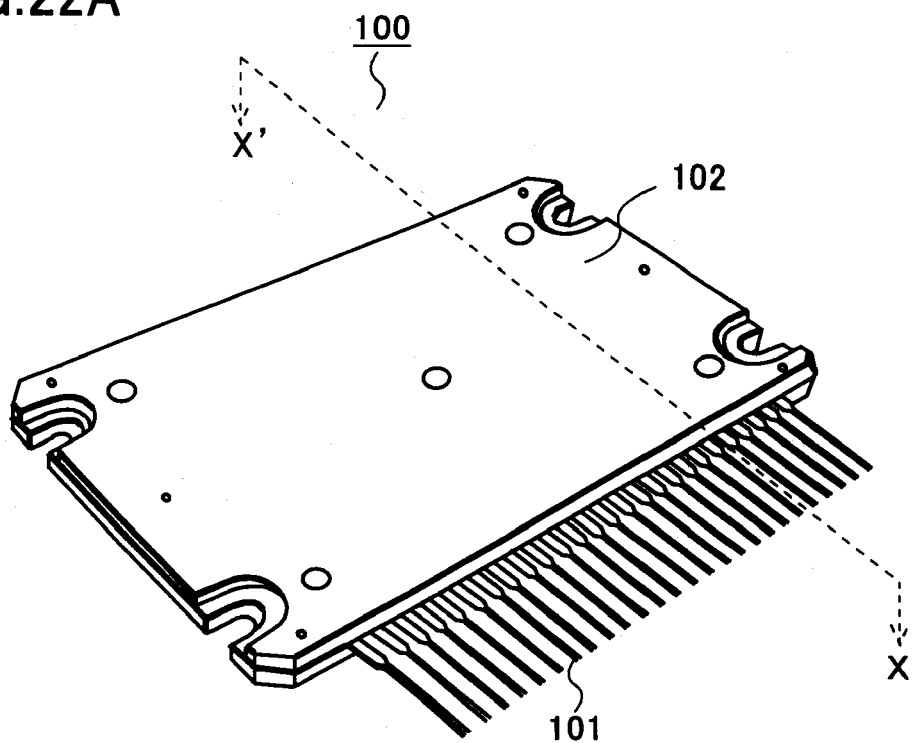
FIG. 22A is a perspective view and FIG. 22B is a cross-sectional view showing a conventional hybrid integrated circuit device.
Figure 22B:
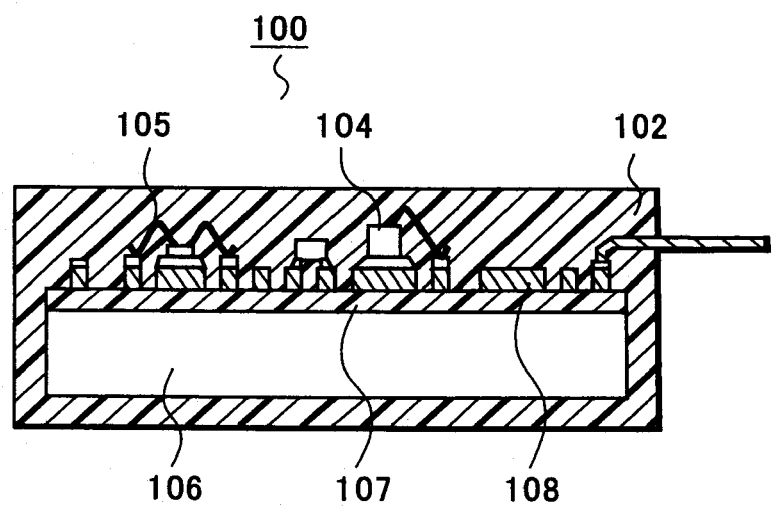

With reference to FIGS. 21A and 21B, a description will be given of the step of the disposing circuit elements 14 in desired spots on the first wiring layer 41.

First, with reference to FIG. 21A, the circuit elements 14 are fixed to the conductive patterns (islands) by use of solder, a conductive paste or the like. Here, the circuit element 14A which performs processing of a small current is fixed to the first conductive pattern 41A. Meanwhile, the circuit element 14B through which a large current flows or from which a large amount of heat is generated is fixed to the second conductive pattern 41B. Next, the circuit elements 14 and the conductive patterns are electrically connected to each other with the thin metal wires 15. Since the first conductive pattern 41A can form a minute pattern, an element having a number of terminals such as an LSI element can be employed as the circuit element 14A. Since the second conductive pattern 41B is formed to be sufficiently thick, a power transistor which performs processing of a large current, an LSI, and the like can be employed as the circuit element 14B.

Next, with reference to FIG. 21B, resin sealing of the circuit board 53 having the circuit elements 14 mounted thereon is performed. As a resin sealing method, transfer molding, injection molding or dipping can be adopted. As a resin material, a thermosetting resin such as an epoxy resin can be used in transfer molding, and a thermoplastic resin such as a polyimide resin and polyphenylene sulfide can be used in injection molding. After the resin sealing is performed, an insulating resin 54 is formed in a predetermined position on the rear surface of the circuit board 53, and external electrodes 46 are provided. Thus, a circuit device is completed.

In the above description of the manufacturing method, the thin first conductive pattern and the thick second conductive pattern are formed in each of the first and the second wiring layers 41 and 42. However, it is also possible to form the thick second conductive pattern only in either layer. In such a case, by omitting some of the manufacturing steps described above, circuit devices of other configurations can be formed. To be more specific, the circuit device 40A can be formed by omitting the steps of forming the convex part 38B of the first wiring layer 41, and the convex parts 38A and 38B of the second wiring layer 42.

In addition, the circuit device 40B can be formed by omitting the steps of forming the convex part 38A of the first wiring layer 41, and the convex parts 38A and 38B of the second wiring layer 42. Moreover, the circuit device 40C can be formed by omitting the step of forming the convex parts 38A and 38B of the second wiring layer 42.

Moreover, the circuit device 40D can be formed by omitting the step of forming the convex parts 38A and 38B of the second wiring layer 42. Furthermore, the circuit device 40E can be formed by omitting the steps of forming the convex parts 38A and 38B of the first wiring layer 41, and the convex part 38B of the second wiring layer 42.

Moreover, the circuit device 40F can be formed by omitting the steps of forming the convex parts 38A and 38B of the first wiring layer 41, and the convex part 38A of the second wiring layer 42. Furthermore, the circuit device 40E can be formed by omitting the step of forming the convex parts 38A and 38B of the first wiring layer 41.

What is claimed is:

1. A circuit device comprising:
a plurality of wiring layers,
wherein any of the wiring layers is formed of a first conductive pattern and a second conductive pattern formed to be thicker than the first conductive pattern,
a convex part is formed so as to position a surface of the second conductive pattern higher than a front surface of the first conductive pattern, and
a convex part is formed so as to position a rear surface of the second conductive pattern lower than a rear surface of the first conductive pattern.

2. The circuit device according to claim 1, wherein the convex part formed in a lower side of the second conductive pattern is buried in an insulating material formed therebelow.

* * * * *